(12) United States Patent
Joo et al.

(10) Patent No.: US 9,735,198 B2
(45) Date of Patent: Aug. 15, 2017

(54) SUBSTRATE BASED LIGHT EMITTER DEVICES, COMPONENTS, AND RELATED METHODS

(71) Applicant: Cree, Inc., Durham, NC (US)

(72) Inventors: Sung Chul Joo, Cary, NC (US); Peter Scott Andrews, Durham, NC (US); Erin Welch, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/834,195

(22) Filed: Mar. 15, 2013

(65) Prior Publication Data

US 2013/0256711 A1 Oct. 3, 2013

Related U.S. Application Data

(63) Continuation-in-part of application No. 13/755,993, filed on Jan. 31, 2013.
(Continued)

(51) Int. Cl.
*H01L 27/15* (2006.01)
*H01L 33/60* (2010.01)
(Continued)

(52) U.S. Cl.
CPC ............ *H01L 27/15* (2013.01); *H01L 24/97* (2013.01); *H01L 33/486* (2013.01);
(Continued)

(58) Field of Classification Search
CPC ........ H01L 33/48; H01L 33/483; H01L 33/60
See application file for complete search history.

(56) References Cited

U.S. PATENT DOCUMENTS 4,946,547 A 8/1990 Palmour
5,200,022 A 4/1993 Kong
(Continued)

FOREIGN PATENT DOCUMENTS

CN 1815766 8/2006
CN 101056960 A 10/2007
(Continued)

OTHER PUBLICATIONS

Non-Final Office Action for U.S. Appl. No. 13/800,284 dated Jun. 30, 2014.
(Continued)

*Primary Examiner* — Benjamin Sandvik
(74) *Attorney, Agent, or Firm* — Jenkins, Wilson, Taylor & Hunt, P.A.

(57) ABSTRACT

Substrate based light emitter devices, components, and related methods are disclosed. In some aspects, light emitter components can include a substrate and a plurality of light emitter devices provided over the substrate. Each device can include a surface mount device (SMD) adapted to mount over an external substrate or heat sink. In some aspects, each device of the plurality of devices can include at least one LED chip electrically connected to one or more traces and at least one pair of bottom contacts adapted to mount over a surface of external substrate. The component can further include a continuous layer of encapsulant disposed over each device of the plurality of devices. Multiple devices can be singulated from the component.

18 Claims, 10 Drawing Sheets

Related U.S. Application Data

(60) Provisional application No. 61/618,327, filed on Mar. 30, 2012, provisional application No. 61/642,995, filed on May 4, 2012.

(51) Int. Cl.
*H01L 33/48* (2010.01)
*H01L 33/50* (2010.01)
*H01L 23/00* (2006.01)

(52) U.S. Cl.
CPC ............ *H01L 33/505* (2013.01); *H01L 33/60* (2013.01); *H01L 33/507* (2013.01); *H01L 2224/48091* (2013.01); *H01L 2224/48227* (2013.01); *H01L 2224/97* (2013.01); *H01L 2924/01322* (2013.01); *H01L 2924/12035* (2013.01); *H01L 2924/12041* (2013.01); *H01L 2924/12042* (2013.01); *H01L 2924/15787* (2013.01); *H01L 2924/181* (2013.01); *H01L 2924/1815* (2013.01)

(56) References Cited

U.S. PATENT DOCUMENTS

| | | |
|---|---|---|
| RE34,861 E | 2/1995 | Davis |
| 6,503,780 B1 | 1/2003 | Glenn et al. |
| 6,686,609 B1 | 2/2004 | Sung |
| 6,936,855 B1 | 8/2005 | Harrah |
| 6,953,255 B2 | 10/2005 | Horiuchi et al. |
| D511,328 S | 11/2005 | Wang |
| 7,066,626 B2 | 6/2006 | Omata |
| 7,213,940 B1 | 5/2007 | Van De Ven |
| D572,210 S | 7/2008 | Lee |
| D615,504 S | 5/2010 | Keller et al. |
| D615,505 S | 5/2010 | Butterworth et al. |
| 7,791,061 B2 | 9/2010 | Edmond |
| D628,966 S | 12/2010 | Kuwaharada et al. |
| D631,020 S | 1/2011 | Chuang et al. |
| D633,631 S | 3/2011 | Shieh et al. |
| D637,565 S | 5/2011 | Wu et al. |
| D642,143 S | 7/2011 | Kuwaharada et al. |
| 7,982,709 B2 | 7/2011 | Sekiguchi et al. |
| D645,416 S | 9/2011 | Kuwaharada et al. |
| 8,058,088 B2 | 11/2011 | Cannon |
| D649,943 S | 12/2011 | Kuwaharada et al. |
| D649,944 S | 12/2011 | Kuwaharada et al. |
| D656,906 S | 4/2012 | Leung |
| D660,813 S | 5/2012 | Otaki et al. |
| 8,202,745 B2 | 6/2012 | Andrews |
| D662,902 S | 7/2012 | Shieh et al. |
| D667,802 S | 9/2012 | Otaki et al. |
| 8,267,550 B2 | 9/2012 | Wang |
| D670,010 S | 10/2012 | Lin |
| D680,504 S | 4/2013 | Noichi |
| 8,563,339 B2 | 10/2013 | Tarsa |
| D698,323 S | 1/2014 | Noichi |
| D698,741 S | 2/2014 | Kobayashi et al. |
| 8,748,915 B2 | 6/2014 | Chan et al. |
| D710,810 S | 8/2014 | Noichi |
| D711,840 S | 8/2014 | Lowes et al. |
| D718,258 S | 11/2014 | Lowes et al. |
| D718,725 S | 12/2014 | Reihrezer et al. |
| 8,969,908 B2 | 3/2015 | Negley et al. |
| D738,832 S | 9/2015 | Hussell et al. |
| 2003/0067761 A1 | 4/2003 | Horiuchi et al. |
| 2004/0056265 A1 | 3/2004 | Arndt et al. |
| 2004/0069993 A1* | 4/2004 | Murano .......... 257/79 |
| 2005/0093005 A1 | 5/2005 | Ruhnau |
| 2005/0184387 A1* | 8/2005 | Collins et al. ............ 257/712 |
| 2005/0219835 A1 | 10/2005 | Nagayama |
| 2005/0221519 A1 | 10/2005 | Leung et al. |
| 2006/0012299 A1 | 1/2006 | Suehiro et al. |
| 2006/0113906 A1 | 6/2006 | Ogawa |
| 2006/0145172 A1* | 7/2006 | Su et al. .......... 257/98 |
| 2006/0157722 A1 | 7/2006 | Takezawa et al. |
| 2006/0220046 A1 | 10/2006 | Yu et al. |
| 2007/0161211 A1* | 7/2007 | Sunohara et al. ............ 438/455 |
| 2007/0228387 A1 | 10/2007 | Negley |
| 2008/0012036 A1 | 1/2008 | Loh |
| 2008/0036362 A1 | 2/2008 | Tanimoto et al. |
| 2008/0173884 A1 | 7/2008 | Chitnis |
| 2008/0179611 A1 | 7/2008 | Chitnis |
| 2008/0203417 A1 | 8/2008 | Konishi et al. |
| 2008/0224608 A1* | 9/2008 | Konishi ................ F21K 9/00 313/505 |
| 2009/0057690 A1* | 3/2009 | Chakraborty .......... H01L 33/44 257/88 |
| 2009/0057699 A1 | 3/2009 | Basin et al. |
| 2009/0057901 A1 | 3/2009 | Lin et al. |
| 2009/0108281 A1 | 4/2009 | Keller |
| 2009/0115313 A1* | 5/2009 | Lu .................. H01L 33/505 313/503 |
| 2009/0140271 A1 | 6/2009 | Sah |
| 2009/0146176 A1* | 6/2009 | Oishi ..................... 257/100 |
| 2009/0315057 A1 | 12/2009 | Konishi et al. |
| 2010/0022040 A1 | 1/2010 | Konishi |
| 2010/0155763 A1 | 6/2010 | Donofrio |
| 2010/0212942 A1 | 8/2010 | Tuan et al. |
| 2010/0237375 A1* | 9/2010 | Yamazaki et al. ............ 257/98 |
| 2010/0252851 A1 | 10/2010 | Emerson |
| 2010/0258830 A1* | 10/2010 | Ide et al. .......... 257/98 |
| 2010/0259706 A1 | 10/2010 | Kuwaharada |
| 2010/0301367 A1 | 12/2010 | Nakamura et al. |
| 2011/0001156 A1 | 1/2011 | Matsuda |
| 2011/0006334 A1* | 1/2011 | Ishii .................. C09K 11/584 257/98 |
| 2011/0018017 A1 | 1/2011 | Bierhuizen et al. |
| 2011/0031524 A1* | 2/2011 | Pei .................. H01L 25/0753 257/99 |
| 2011/0062471 A1 | 3/2011 | Bierhuizen et al. |
| 2011/0079801 A1 | 4/2011 | Zhang et al. |
| 2011/0089465 A1 | 4/2011 | Lin et al. |
| 2011/0127903 A1 | 6/2011 | Yao |
| 2011/0220929 A1 | 9/2011 | Collins et al. |
| 2011/0273079 A1 | 11/2011 | Pickard et al. |
| 2011/0309396 A1 | 12/2011 | Wang et al. |
| 2011/0316024 A1* | 12/2011 | Hung .................. H01L 33/486 257/98 |
| 2012/0153340 A1* | 6/2012 | Song .................. G02B 6/4201 257/99 |
| 2012/0299022 A1 | 11/2012 | Hussell |
| 2012/0305949 A1 | 12/2012 | Donofrio |
| 2012/0319150 A1* | 12/2012 | Shimomura ............ H01L 24/97 257/98 |
| 2013/0087822 A1 | 4/2013 | Kim |
| 2013/0099265 A1 | 4/2013 | Hwang |
| 2013/0193468 A1 | 8/2013 | Hussell |
| 2013/0270592 A1 | 10/2013 | Reiherzer |
| 2013/0279169 A1 | 10/2013 | Reiherzer |
| 2014/0291715 A1 | 10/2014 | Reiherzer et al. |

FOREIGN PATENT DOCUMENTS

| | | |
|---|---|---|
| CN | 102280567 CN | 12/2011 |
| CN | ZL 201330359083.X | 5/2014 |
| JP | 2000-022218 | 1/2000 |
| JP | 2001-160630 | 6/2001 |
| JP | 2006-093435 | 4/2006 |
| JP | 2007-189006 | 7/2007 |
| JP | 2009-146935 | 7/2009 |
| JP | D140389 | 5/2011 |
| KR | 10-0829910 | 5/2008 |
| KR | 10-0933920 | 12/2009 |
| KR | 10-2010-0008509 | 1/2010 |
| KR | 10-2011-01119140 | 10/2011 |
| TW | D140389 | 5/2011 |
| TW | D162119 | 8/2014 |
| WO | WO 2013/148823 | 10/2013 |

(56) References Cited

FOREIGN PATENT DOCUMENTS

WO  WO 2013/148826  10/2013
WO  WO 2014/120256  5/2014

OTHER PUBLICATIONS

Restriction Requirement for U.S. Appl. No. 13/755,993 dated Jul. 10, 2014.
Chinese Correction of Deficiencies for Application No. 201330359083.X dated Nov. 5, 2013.
Taiwanese Office Action and Search Report for Application No. 102302923 dated Dec. 30, 2013.
Chinese Notice of Grant for Application No. 201330359083.X dated Jan. 26, 2014.
Taiwanese Notice of Allowance for Application No. 102302923 dated Apr. 7, 2014.
Restriction Requirement for U.S. Appl. No. 13/800,284 dated Mar. 31, 2014.
U.S Appl. No. 13/607,217 dated Sep. 7, 2012.
International Search Report and Written Opinion for Application No. PCT/US2013/034084 dated Jul. 25, 2013.
International Search Report and Written Opinion for Application No. PCT/US2013/034087 dated Jul. 25, 2013.
International Search Report and Written Opinion for Application No. PCT/US2013/035411 dated Oct. 15, 2013.
Non-Final Office Action for U.S. Appl. No. 13/755,993 dated Nov. 5, 2014.
Final Office Action for U.S. Appl. No. 13/800,284 dated Dec. 16, 2014.
Restriction Requirement for U.S. Appl. No. 29/444,591 dated Jan. 30, 2015.
Non-Final Office Action for U.S. Appl. No. 13/800,260 dated Feb. 5, 2015.
Machine translation of JP 200-022218 A published Jan. 21, 2000 Tadaaki.
Machine translation of KR 10-2009-0049979 published Dec. 28, 2009 Kim et al.
Final Office Action for U.S. Appl. No. 13/755,993 dated Mar. 6, 2015.
Advisory Action for U.S. Appl. No. 13/800,284 dated Mar. 13, 2015.
Interview Summary for U.S. Appl. No. 13/800,284 dated Mar. 19, 2015.
Notice of Allowance for U.S. Appl. No. 29/444,591 dated May 12, 2015.
Non-Final Office Action for U.S. Appl. No. 13/800,284 dated Jun. 4, 2015.
Final Office Action for U.S. Appl. No. 13/800,260 dated Jul. 23, 2015.
Chinese Office Action for Application No. 2013800181871 dated Oct. 17, 2016.
Advisory Action for U.S. Appl. No. 13/800,260 dated Oct. 14, 2015.
Non-Final Office Action for U.S. Appl. No. 13/755,993 dated Nov. 27, 2015.
Advisory Action for U.S. Appl. No. 13/800,284 dated Jan. 4, 2016.
Non-Final Office Action for U.S. Appl. No. 13/800,284 dated May 19, 2016.
Final Office Action for U.S. Appl. No. 13/755,993 dated Apr. 8, 2016.
Non-Final Office Action for U.S. Appl. No. 13/800,260 dated Jun. 15, 2016.
Advisory Action for U.S. Appl. No. 13/755,993 dated Jun. 16, 2016.
Chinese Office Action for Application No. 2013800181871 dated Apr. 25, 2016.
Chinese Office Action for Application No. 201380018673 dated Jun. 21, 2016.
Non-Final Office Action for Application 13755993 dated Sep. 22, 2016.
Final Office Action for U.S. Appl. No. 13/755,993 dated Mar. 13, 2017.
Chinese Office Action for Application No. 2013800181871 dated Apr. 20, 2017.
Interview Summary for U.S. Appl. No. 13/755,993 dated Apr. 25, 2017.
Non-Final Office Action for U.S. Appl. No. 13/800,284 dated May 1, 2017.
Notice of Allowance and After Final Consideration Program Decision for U.S. Appl. No. 13/755,993 dated Jun. 1, 2017.
Notice of Issuance for Chinese Application No. 201380071952.6 dated Jun. 2, 2017.

* cited by examiner

SUBSTRATE BASED LIGHT EMITTER DEVICES, COMPONENTS, AND RELATED METHODS

CROSS REFERENCE TO RELATED APPLICATIONS

This application relates to, is a continuation-in-part of, and claims priority to U.S. patent application Ser. No. 13/755,993, filed Jan. 31, 2013, which claims priority to U.S. Provisional Patent Application Ser. Nos. 61/618,327, filed Mar. 30, 2012, and 61/642,995, filed May 4, 2012, the disclosures of each of which are incorporated by reference herein in the entireties.

TECHNICAL FIELD

The subject matter disclosed herein relates generally to substrate based light emitter devices, components, and related methods. More particularly, the subject matter disclosed herein relates to batch processed substrate based devices components, and related methods.

BACKGROUND

Light emitting diodes (LEDs) or LED chips are solid state devices that convert electrical energy into light. LED chips can be utilized in light emitter devices or components for providing different colors and patterns of light useful in various lighting and optoelectronic applications. Light emitter devices can include surface mount devices (SMDs) which can be mounted directly onto the surface of an underlying circuit component or heat sink, such as a printed circuit board (PCB) or metal core printed circuit board (MCPCB). SMDs can comprise bottom electrical contacts or leads configured to directly mount to the underlying circuit component. SMDs can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Devices and components incorporating fewer raw materials at sustained or increased brightness levels using the same or less power are becoming more desirable.

Conventional light emitter devices, components, and methods utilize one or more LED chips individually mounted within a molded component body and/or individually mounted and individually encapsulated over a ceramic body. Individually molding, individually encapsulating, and/or individually processing devices can be both expensive and time-consuming. For example, problems associated with individually encapsulating LED chips includes sticking, inconsistent dispenses (e.g., over/under fills), and the increased time associated with individually encapsulating LED chips can cause phosphors to settle. Thus, obtaining consistent color targeting has been a problem. To date, there are no batch processed and/or batch encapsulated light emitter devices or components, but rather current devices and/or components are individually processed and/or provided.

Thus, despite the availability of various light emitter devices and components in the marketplace, a need remains for devices, components, and methods which can be produced quickly, efficiently, and at a lower cost. In some aspects, substrate based devices and components can allow for customized light emitter products having different trace patterns, different via placement, different LED chip connectivity, different dimensions, and/or different optical properties. Devices and components can be single or multi-chip components, and can make it easier for end-users to justify switching to LED products from a return on investment or payback perspective.

SUMMARY

In accordance with this disclosure, substrate based light emitter devices, components, and related methods having improved manufacturability and customization are provided and described herein. Devices, components, and methods described herein can advantageously exhibit improved processing times, ease of manufacture, and/or lower processing costs. Devices, components, and related methods described herein can be well suited for a variety of applications such as personal, industrial, and commercial lighting applications including, for example, light bulbs and light fixture products and/or applications. In some aspects, devices, components, and related methods described herein can comprise improved (e.g., less expensive and more efficient) manufacturing processes and/or improved optical properties including consistent color targeting and improved reflection. This can provide devices and components having excellent brightness with a smaller footprint. It is, therefore, an object of the present disclosure to provide light emitter devices, components, and methods that are substrate based, in some aspects, by allowing a multitude of different devices to be created over a substrate component, without incurring the expense associated with custom fabricated packages.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
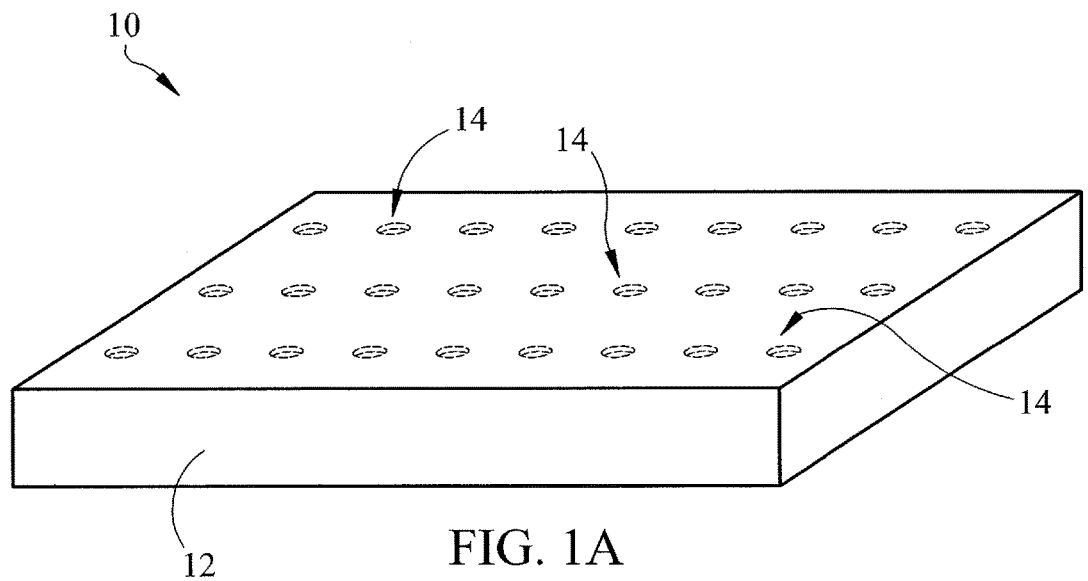
FIGS. 1A to 1D are perspective views illustrating substrate based light emitter devices and components according to aspects of the disclosure herein.

The subject matter disclosed herein is directed to substrate based light emitter devices, components, and related methods, for use with light emitting diode (LED) chips. Devices, components, and methods provided herein can exhibit improved manufacturability as well as provide for customized devices and components for supporting LED chips and allowing electrically connectivity thereof, without incurring the expense associated with custom fabricated ceramic or plastic packages.

In some aspects, substrate based devices can be processed as a batch. That is, multiple LED chips can be die attached proximate a same time, wirebonded proximate a same time, encapsulated proximate a same time via one large application of encapsulant, among other processes. Such processing techniques can unexpectedly provide for a more consistent color across multiple devices, thus, there can be less waste.

In some aspects, devices, components, and methods described herein can include ablating material between adjacent devices on a given component during a batch process such as scribing. In some aspects, a reflective material can be provided in the ablated regions. In other aspects, devices can be singulated without filling the ablated regions.

Notably, one, two, or multiple layers of encapsulant can be provided for forming an optical element, as a batch, over multiple devices and/or components as described herein. In some aspects, each layer can comprise a same or a different composition and/or color of phosphor. In other aspects, some layers can comprise a phosphor and some layers can be optically clear and/or be devoid of phosphor. In further aspects, each layer can be devoid of phosphor. Notably, encapsulant can be applied in one continuous layer over the substrate and devices, prior to encapsulation.

Notably, devices, components, and related methods described herein can provide efficient and cost-effective light emitter products, which can be easily customized and provide a consistent, predictable desired color point without resulting in wasted product.

Devices and components provided herein can comprise a reflective lateral side wall comprised of a reflective material. In some aspects, the reflective material can be applied during a batch processing step, and can be dispensed. In other aspects, the reflective lateral side wall can comprise a reflector inserted into one or more ablated regions of material formed during a scribing process. The wall can be disposed over a lower recessed portion or ledge of substrate at least partially above a height or upper surface of a light emitter chip. Another portion of the wall can be disposed below a level, such as a bottom surface level, of the light emitter chip. This can be advantageous, as light emitted below the LED chip can be reflected out by lower portion of the wall.

In alternative aspects, devices and components provided herein can comprise and/or at least partially comprise a non-reflective lateral side wall. That is, in some aspects, a side wall can be provided when material is provided within scribe marks, and when devices are singulated from a component. Material can be applied into scribe marks during a batch processing step, and can be dispensed. In other aspects, the material forming the lateral side wall can comprise a body of material that can be inserted into one or more ablated regions of material formed during a scribing process. In some aspects, the side wall can comprise a material adapted to block light, a material adapted to absorb light, a material adapted to filter light, a material adapted to diffuse light, combinations thereof, and/or any of the aforementioned materials can be used in combination with a reflector or reflective material. The wall can be disposed over a lower recessed portion or ledge of substrate below or partially above a height or upper surface of a light emitter chip.

In further aspects, devices described herein can be devoid of an outer reflector, an outer layer of reflective material, and/or a reflective wall. In some aspects, a device can comprise an ablated edge. The ablated edge of the device can comprise a portion of encapsulant disposed flush against one side of the substrate. In some aspects, a lower recessed portion or ledge of the substrate can extend below the ablated edge. This can be advantageous, as light emitted by the LED chip can be reflected back up via the ledge of substrate, as substrate can comprise a highly reflective ceramic material.

In further aspects, devices described herein can have the reflective wall added from the backside of the substrate. Ablation or removal of material from the backside of the substrate, relative to the LED, and extending into the encapsulated region of the LED side is advantageous as this allows angles to be easily formed which are advantageous to light output. The created region is then filled with reflective material to form a reflective cavity for the light. (See picture at end of this document).

As used herein, the terms "batch processing" or processing as a "batch" refer to performing a particular operation on a group of devices or components all at once rather than manually operating on each device or component, one at a time.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device or component in addition to the orientation depicted in the figures. For example, if the device or component in the figures is turned over, structure or portion described as "above" other structures or portions would now be oriented "below" the other structures or portions. Likewise, if devices or components in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein, the terms "through-hole", "thru-hole", and/or "via" are synonymous and refer an opening in the panel substrate and/or a submount, often filled and/or lined (e.g., along one or more side walls) with an electrically conductive material that allows for an electrically conductive conduit or pathway between different layers, surfaces, or features of the devices or components. The term "exposing" a thru-hole or via refers to sawing, cutting, dicing, breaking, etching, uncovering, displacing, or otherwise causing the metal disposed inside the via to be exposed on an external surface of the panel substrate or submount. Thus, the conductive material will be "exposed" outside of and/or along an exterior, outer surface of the device, component, panel substrate, or submount.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

Light emitter devices and components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In some aspects, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861, U.S. Pat. No. 4,946,547, and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties. LED chips used and/or described herein can be configured to emit blue light, cyan light, green light, yellow light, red light, amber light, red-orange light, and/or any combination(s) thereof.

As described herein, one or more LED chips can be at least partially coated with one or more phosphors and/or one or more layers of phosphors. Phosphors can be adapted to emit blue light, yellow light, green light, red light, or any combination(s) thereof upon being impinged with light emitted via one or more LED chips. That is, in some aspects one or more phosphors can absorb a portion of light emitted by the LED chip and in-turn reemit the absorbed light at a different wavelength such that the light emitter device or component emits a combination of light from each of the LED chip(s) and the phosphor(s). In one embodiment, the light emitter devices and components described herein can emit what is perceived as white light resulting from a combination of light emission from the LED chip and the phosphor. In one embodiment according to the present subject matter, white emitting devices and components can consist of an LED chip that emits light in the blue wavelength spectrum and a phosphor that absorbs some of the blue light and re-emits light in the green, yellow, and/or red wavelength spectrum. The devices and components can therefore emit a white light combination across the visible spectrum of light. In other embodiments, the LED chips can emit a non-white light combination of blue and yellow light as described in U.S. Pat. No. 7,213,940. LED chips emitting red light or LED chips covered by a phosphor that absorbs LED light and emits a red light is also contemplated herein.

LED chips can be coated with a phosphor using many different methods, with one suitable method being described in U.S. patent application Ser. Nos. 11/656,759 and 11/899, 790, both entitled "Wafer Level Phosphor Coating Method and Devices Fabricated Utilizing Method", and both of which are incorporated herein by reference in their entireties. Other suitable methods for coating one or more LED chips are described for example in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter devices, components, and methods according to the present subject matter can also have multiple LED chips of different colors, one or more of which can be white emitting.

FIGS. 1A through 9 illustrate embodiments of substrate based light emitter devices, components, and related methods according to the present subject matter as disclosed and described herein. In some aspects, light emitter devices described herein can comprise surface mount devices (SMDs). FIGS. 1A to 1D illustrate a substrate based light emitter component, generally designated 10, from which one or more light emitter devices (e.g., FIG. 5) can be singulated. In some aspects, FIGS. 1A to 1D can be illustrative of component 10 as it is subjected to various batch processing steps and/or manufacturing stages. Notably, a plurality of components 10 can be processed together as a batch. This can provide consistent color targeting across a plurality of devices which can be singulated therefrom, improve processing time, and reduce processing costs.

Figures 5, 6A, 6B:
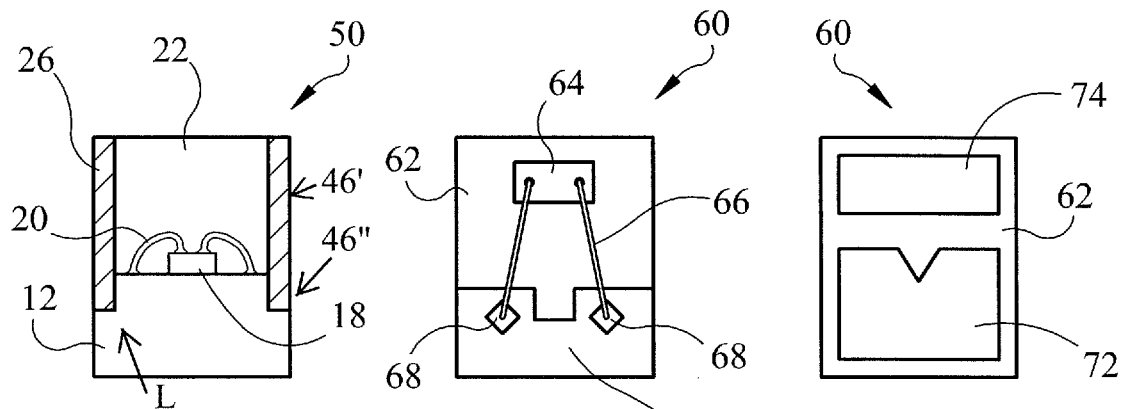
FIG. 5 is a side view illustrating a substrate based light emitting device according to aspects of the disclosure herein.
FIGS. 6A and 6B are top and bottom views, respectively, illustrating a substrate based light emitting device according to aspects of the disclosure herein.

Referring to FIG. 1A and in some aspects, component 10 can comprise a panel or panel substrate 12 from which multiple individual substrate based devices can be singulated (e.g., 50, FIG. 5). Notably, customized devices can be inexpensively built and manufactured as a batch, in one or more novel processing steps over substrate 12 prior to singulation into individual devices. That is, in some aspects substrate 12 can provide a base or support for devices which can be customized per consumer and/or customer needs or requirements. For example, substrate 12 can be customized in regards to a type, size, build, structure, number and/or color of LED chip(s), a size and shape of customized traces, provision of customized reflectors, provision of customized optical elements, and/or provision of vias, prior to singulation into individual devices. Other aspects can be customized as well, including the ultimate size of each device to be singulated. In some aspects, individually customized components 10 can be provided over and/or supported via substrate 12, and can be referred to as comprising "substrate based" components.

In some aspects, substrate 12 can comprise a metallic material, a non-metallic material, a ceramic material, a plastic material, a composite material, a flame retardant (e.g., FR-4) composite material, combinations thereof, or any other type of material. In some aspects, substrate 12 can comprise a highly reflective and/or optionally transparent ceramic based material for maximizing light extraction and reflectance from light emitters. In some aspects, substrate 12 can comprise aluminum oxide (e.g., alumina or $Al_2O_3$) or derivatives thereof, aluminum nitride (AlN) or derivatives thereof, zirconium dioxide ($ZrO_2$) or derivatives thereof, or any other ceramic based material.

In some aspects, substrate 12 can comprise a ceramic body that can be cast from low temperature co-fired ceramic (LTCC) materials or high temperature co-fired ceramic (HTCC) materials and/or via related processes. In one aspect, substrate 12 can be cast from a thin green ceramic tape and subsequently fired. Where used, the ceramic tape can comprise any ceramic filler material known in the art, for example, substrate 12 can comprise a glass ceramic, such as $Al_2O_3$ or aluminum nitride (AlN) having approximately 0.3 to 0.5 weight percent of glass frits. The glass frits can be used as a binder and/or sintering inhibitor within the ceramic tape when the tape is fired.

In some aspects using a green ceramic tape for substrate 12 can advantageously provide a substrate having any desired thickness, thus contributing to thinner or thicker sizes, where required. Such features can be easily customized, where desired. In some aspects, substrate 12 can comprise a ceramic material having any of a variety of light scattering particles contained therein. Examples of suitable scattering particles can, for example, comprise particles of $Al_2O_3$, $TiO_2$, $BaSO_4$, and/or AlN. In some aspects, substrate 12 can optionally be produced by thin- or thick-film processing techniques available at and including products available from CoorsTek, headquartered in Golden, Colo. Such substrate 12 can optionally be fired along with other materials (e.g., zirconia, $ZrO_2$) to further improve optical and mechanical properties.

Substrate 12 can comprise a panel of any suitable size, shape, orientation, and/or configuration. For illustration purposes, a substantially square or rectangular shaped substrate 12 is shown, however, any shape of substrate is contemplated herein. For example, any one of a substantially rectangular, circular, oval, rounded, regular, irregular, or asymmetrically shaped substrate is also contemplated herein. Substrate 12 can for example comprise a substantially square or rectangular shape having at least one side of at least approximately 2 inches (") or more; 4" or more; 8" or more, or more than 12". In some aspects, substrate 12 can be provided as a long material (e.g., on a reel). The material can be unrolled from the reel and devices thereon can be batch processed (e.g., batch die attached, batch encapsulated, etc.) and individual devices can be singulated therefrom after encapsulation and formation of an optical reflector or application of reflective material (26, FIG. 2E). Substrate 12 can comprise any suitable thickness, for example, a thickness of approximately 2 mm or less, such as approximately 1 mm or less, approximately 0.5 mm or less, or approximately 0.25 mm or less. In some aspects, substrate 12 comprises a thickness of about 0.635 mm.

In some aspects, the size, shape, and/or thickness of substrate 12 can each be customized, where necessary, and can obviate the need for providing individually molded and/or individually pressed ceramic substrates.

Still referring to FIG. 1A and in some aspects, substrate 12 can optionally comprise one or more openings, through-holes or vias, generally designated 14. For illustration purposes, a plurality of substantially circular shaped vias 14 are illustrated, however, any size, shape, and/or cross-sectional shape of vias 14 can be provided. Vias 14 are illustrated in broken lines as they are optional and/or may not be visible (e.g., very small). Where used, vias 14 can be drilled, punched, machined, etched, formed with a laser, or any other processing technique. An electrically conductive material, such as a metal or metal alloy, can be provided inside portions of vias 14 for creating electrically conductive conduits through substrate 12.

In some aspects, vias 14 can be filled with and/or have side walls at least partially coated with a metal and/or a conductive material such as silver (Ag), copper (Cu), gold (Au), tin (Sn), platinum (Pt), and/or Ag, Cu, Au, Sn, or Pt alloys for electrically connecting top electrical contacts with bottom electrical contacts of an SMD type device or component. In other aspects, conductive material disposed within vias 14 can be exposed during singulation (e.g. sawn, diced, broken, etc.) thereby providing vias 14 along one or more sides to form novel electrical contacts disposed on three surfaces of the component (e.g., a top surface, a bottom surface, and a lateral side surface). Vias 14, where used, can be customized with respect to size, shape, number, and placement.

Figure 1B:
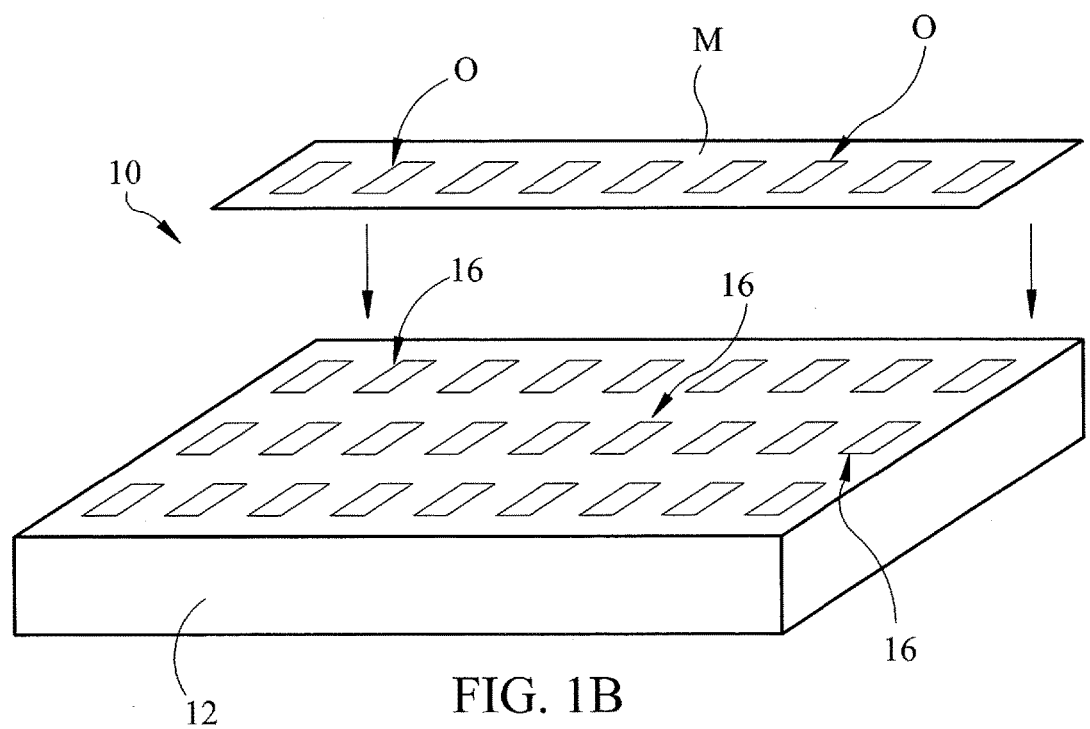

FIG. 1B illustrates one or more electrically conductive contacts or traces 16 disposed over a first surface of substrate 12. Where optional vias 14 (FIG. 1) are present, electrical traces 16 can be at least partially disposed over and/or cover vias 14 such that they may not be visible. Traces 16 can be customized with respect to size, shape, and/or placement over substrate 12. In some aspects, traces 16 can be coated or deposited over substrate 12 via physical deposition techniques, chemical deposition techniques, vapor deposition techniques, electroless plating techniques, electroplating techniques, or any other coating technique.

In other aspects, an optional mask M having a plurality of openings O can be applied prior to deposition of traces 16, such that traces can be printed, stenciled, or screen-printed over substrate. That is, mask M allows traces 16 to only be applied or deposited over substrate 12 within the boundaries of openings O. Mask M can advantageously cover portions of substrate 16 and protect the reflectivity or "whiteness" of substrate 16 by preventing metal deposition within such areas. Thus, in some aspects, traces 16 can be applied via shadow, stenciling, mask, printing, screen printing, lithography, or any other similar masking/covering technique.

In some aspects, traces 16 can comprise one more layers of Cu, titanium (Ti), nickel (Ni), Ag, electroless Ag, Au, electroless nickel immersion gold (ENIG), Sn, palladium (Pd), electrolytic or immersion Au, combinations thereof, and/or any other material which can be applied via a deposition process, such as physical deposition, sputtering, e-beam, electroplating, and/or electroless plating processes noted above. In some aspects, traces 16 can comprise multiple different layers of metals or materials applied or coated in layers over each other. For example, one or more layers of Ti, Ag, and/or Cu can be applied over substrate 12. In some aspects, a layer of Ti can be directly deposited directly over substrate 16. The Ti layer can be coated with one or more layers of Ag and/or Cu. In other aspects, one or more alternating layers of metal (e.g., alternating layers of Ti, Ag, and/or Cu) can be applied over substrate 12. In some aspects, traces 16 can comprise at least one layer of Ag, either alone or in combination with layers of electroplated Ti, Ni, Cu, and/or Au. In other aspects, traces 16 can comprise at least one layer of Cu, either alone or in combination with layers of electroless or electroplated Ti, Ag, Ni, and/or Au. In some aspects, each trace 16 of the plurality of traces can comprise an overall thickness of approximately 10 μm or more, approximately 20 μm or more, approximately 50 μm or more, or more than approximately 80 μm.

Traces 16 of component 10 can be disposed along a front side corresponding to top surface of substrate 12 and spaced apart from LED chips 18. Together, two traces 16 can comprise an anode/cathode pair adapted to transfer electrical current into and out of LED chips 18, causing the illumination thereof, when subjected to electrical current. In some aspects, each trace 16 can be fully disposed on a top side or top surface of substrate 12. In other aspects traces which wrap around sides of substrate 12 can be provided. In some aspects, vias 14 (FIG. 1A) can allow traces 16 to electrically communicate with bottom contacts (e.g., 72, 74, FIG. 6B).

Figure 1C:
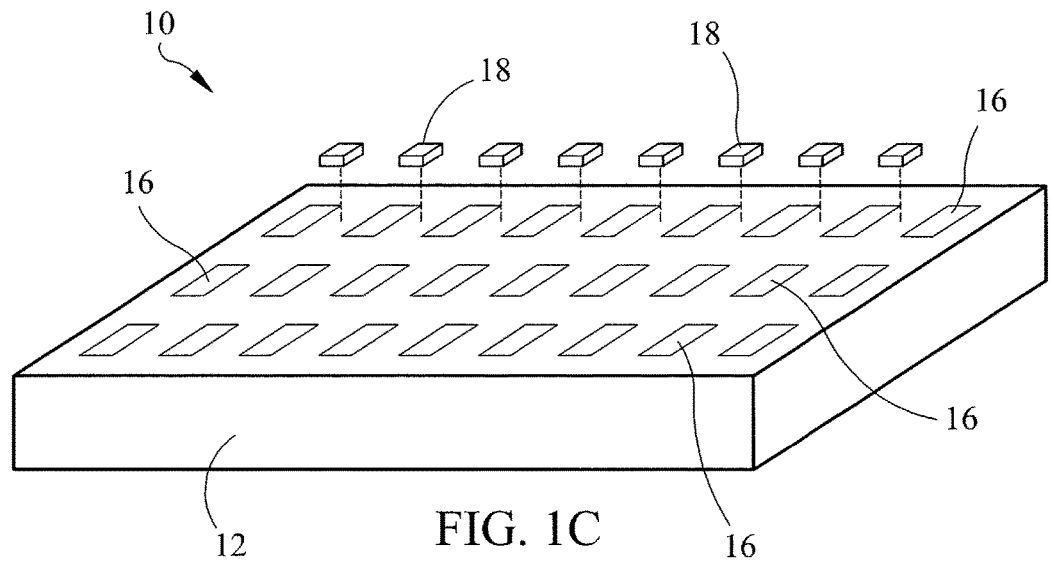

As FIG. 1C illustrates, a plurality of LED chips 18 can be die attached to and/or mounted over front side of substrate 12, adjacent traces 16. In some aspects, LED chips 18 can be disposed between one or more traces 16 and wirebonded thereto. In other aspects, LED chips 18 can be directly attached over portions of one or more traces, for example, where the LED chips 18 have electrical contacts on a bottom surface of the chip. LED chips 18 can be vertically structured (e.g., contacts on two opposing surfaces) or horizontally structured (e.g., both contacts on a same surface, such as an upper or lower surface).

In some aspects, LED chips 18 can comprise substantially straight cut and/or bevel cut (e.g., sloped or inclined) lateral sides and can comprise any shape, size, dimension, structure, build, and/or color. Notably, devices, components, and methods described herein can be customized using any type and/or number of LED chips 18, as desired. In some aspects, each LED chip 18 of the plurality of die attached chips can comprise a same shape, size, dimension, structure, build, and/or color. In other aspects, some LED chips 18 of the plurality of LED chips 18 can comprise different shapes, sizes, dimensions, structures, builds and/or colors. In some aspects, multiple components 10 can be processed at a same time, and can contain different numbers, sizes, shapes, etc. of LED chips 18. Any single type or combinations of different LED chips 18 can be provided. LED chips 18 can comprise a growth substrate or a carrier substrate, and can comprise a vertically structured chip (e.g., anode and cathode on opposing surfaces of LED chip 18) or a horizontally structured chip (e.g., anode and cathode on a same surface).

Still referring to FIG. 1C, LED chips 18 can comprise any size and/or shape. In some aspects, LED chips 18 can be substantially square, rectangular, regular, irregular, or asymmetrical in shape. In some aspects, LED chips 18 can, for example, comprise a footprint where at least one side measures approximately 2000 μm or less, such as approximately 1150 μm or less, approximately 900 μm or less, approximately 700 μm or less, approximately 600 μm or less, approximately 500 μm or less, approximately 400 μm or less, approximately 300 μm or less, approximately 200 μm or less, approximately 100 μm or less, and/or combinations thereof where multiple LED chips 18 are used. Any dimension of LED chip 18 is contemplated.

Figure 1D:
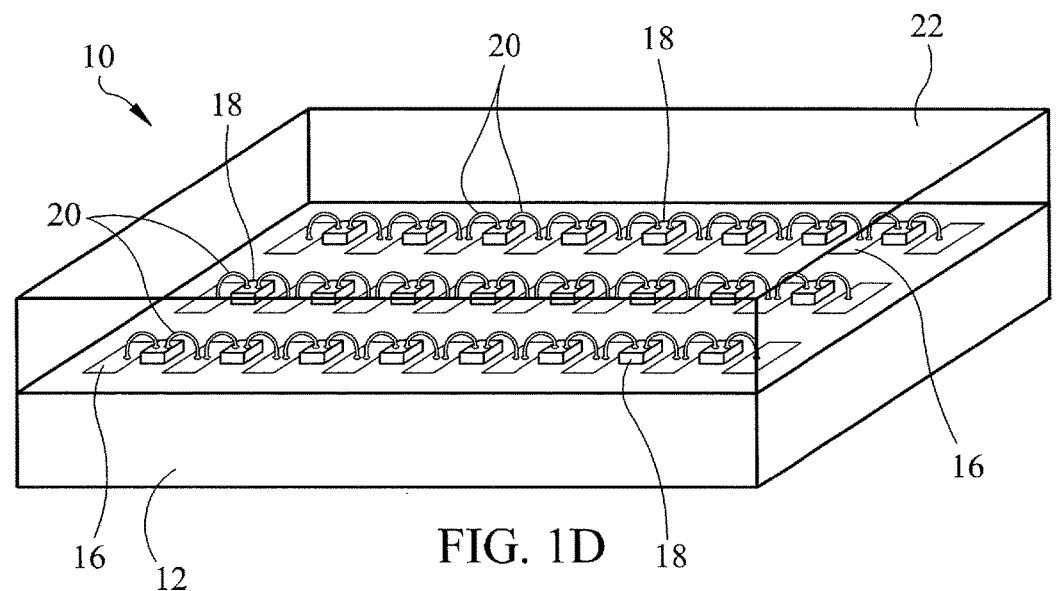

As FIG. 1D illustrates, LED chips 18 can be electrically connected to traces 16 via wirebonds 20. For illustration purposes, horizontally structured LED chips 18 are illustrated, where both the anode and the cathode can be disposed on the upper surface of each chip 18 in the form of two bond pads, each connected to a different trace 16 via wirebonds 20. However, both contacts (e.g., the anode and cathode) could be disposed on a bottom surface of LED chips 18 and/or on opposing top and bottom surfaces as well.

In some aspects, wirebonds 20 can comprise any suitable electrically conductive material such as Au, Ag, Al, Sn, Cu, alloys thereof, and/or combinations thereof. It is understood that in other aspects, a component according to the present subject matter can be provided with an optional electrostatic discharge (ESD) protection device (not shown) reversed biased with respect to LED chips 18. Where used, the ESD protection device can comprise a Zener diode, a surface mount varistor, a lateral Si diode, and/or another LED chip that can be reversed biased with respect to one or more other LED chips 18.

Notably, an optical element or optical material can be provided over component 10. In some aspects, an optical element or material can comprise encapsulant 22 that can be provided and applied substantially entirely over substrate 12, traces 16, LED chips 18, and wirebonds 20 as further illustrated by FIG. 1D. That is, LED chips 18 supported thereon can be encapsulated in one batch encapsulation process rather than by a single encapsulation process and substrate 12 can be substantially covered with at least one large optical element or layer of encapsulant 22. In some aspects, encapsulant 22 can comprise a single and continuous layer or layers of material over substrate 12, prior to singulation of component 10 into individual devices. That is, the volume of encapsulant 22 can be large upon application. In general an application of encapsulant 22 can be anywhere from just covering the surface of the LED chips 16 and wirebonds (e.g., the thinnest possible layer for providing mechanical protection). In other aspects, encapsulant 22 can be applied for low profile applications to aspect ratios of approximately 15× the height of the chip which has been shown to improve light extraction. Height of encapsulation 22 can affect beam shaping of the final product so there could be applications that require approximately a 30× aspect ratio. In general, about 800 μm of encapsulation 22 height is considered typical.

In some aspects, encapsulant 22 can provide both environmental and/or mechanical protection of LED chips 18, wirebonds 20, and traces 16. An optional layer of wavelength conversion material (not shown) such as one or more phosphoric or lumiphoric materials can be applied directly over the one or more LED chips 18 and/or over one or more portions of substrate 12 and traces 16 prior to application of encapsulant 22. In other aspects, the wavelength conversion material can be provided and/or mixed within encapsulant 22, such that upon depositing encapsulant the wavelength conversion material is also deposited. In further aspects, encapsulant 22 can be devoid of a wavelength conversion material. In further aspects, wavelength conversion material can be provided in a reflective material (e.g., 26 FIG. 2E), where reflective material is used. In some aspects, wavelength conversion material can be applied in encapsulant 22 and/or the reflective material (26, FIG. 2E), where reflective material is used. In some aspects, a wavelength conversion material, such as one more phosphors or lumiphors can provide for improved color mixing and provision of truer neutral white light having a truer, improved color rendering, and/or and what is perceived as a true or neutral white color output, where desired.

In some aspects, batch processing and batch encapsulating multiple LED chips 18 of substrate 12, prior to singulation can improve both the cost and the ease of production with regard to components 10. For example, in some aspects cost can be improved as the time, tools, materials, and/or other costs associated with individually molding lenses over substrate 12 can be obviated. In further aspects, any potential sticking and/or other processing defects associated with individually dispensing encapsulant multiple times over multiple LED chips can be eliminated. Notably, dispensing encapsulant in at least one single layer over substrate 12 and LED chips 18 supported thereon can advantageously improve (e.g., decrease) a manufacturing time as well. In some aspects, encapsulant 22 can be cured after dispensing over substrate 12 and LED chips 16 disposed thereon. As described below, more than one layer of encapsulant 22 can be provided.

FIGS. 2A to 2F illustrate side views of device 10, and illustrate one or more processing steps occurring just prior to, or just after applying and curing encapsulant 22. For illustration purposes, substrate 12 is shown as comprising a substantially square or rectangular cross-sectional shape. However, any other non-rectangular shape is also contemplated herein. Notably, substrates 12 described herein can comprise the building block of customized SMD type emitter components and/or devices described herein. A multitude of different customized components, having, for example, customized reflectors, customized side walls, shaped or faceted encapsulant or optical elements provided thereon, and any type/shape/size/number/color of LED chips for producing a desired color point can be provided and/or easily modified without the time and/or expense associated with creating custom fabricated or molded components.

Figure 2A:
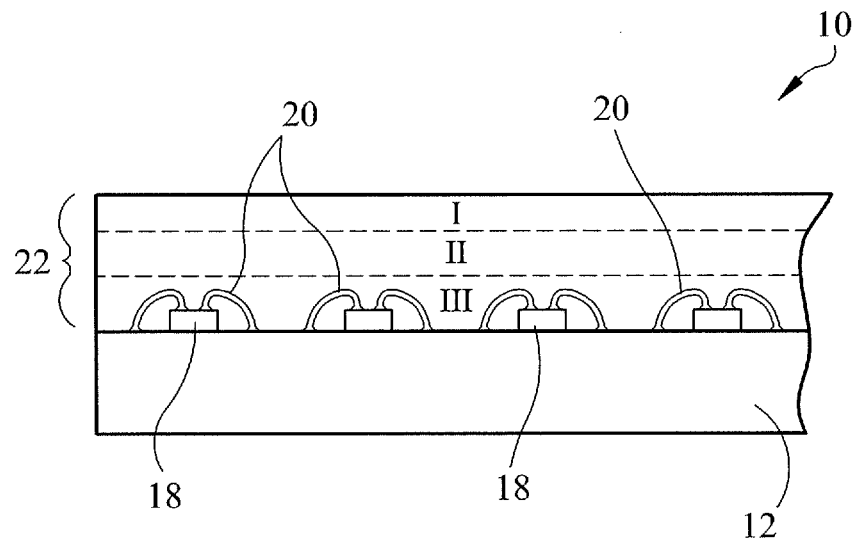
FIGS. 2A to 2F are side views illustrating portions of substrate based light emitter devices and components according to aspects of the disclosure herein.

As the broken lines in FIG. 2A illustrate, encapsulant 22 can optionally comprise one or more multiple layers, such as layers I, II, and III. In some aspects, each layer can be substantially optically clear. In other aspects each different layer can comprise a different concentration and/or color of a wavelength conversion material (e.g., a phosphor or lumiphor). In further aspects, the layers I, II, and III can comprise one or more combinations of any number of optically clear layers and any number of layers containing phosphor. Further, instead of and/or in addition to phosphor, one or more layers I, II, and III can comprise filtering particles or materials, diffusing particles or materials, and/or reflective particles or materials. In some aspects, each layer I, II, and III can be individually applied/deposited and individually cured. In other aspects, each layer within the stack of layers can be cured at the same time. For illustration purposes only, the broken lines indicate three different layers I, II, and III, however, a single layer, two layers, or more than three layers of encapsulant, with or without phosphor(s) or other materials, can be provided and are contemplated herein.

Notably, the large area of encapsulant 22, which extends substantially to outermost edges of substrate 12, can be dispensed, molded in one large mold, or applied via spray techniques. In some aspects, encapsulant 22 can be applied in via a coating method such as, for example, via spin coating. Notably, batch encapsulation can minimize color scattering and improve color consistency by reducing "settling" or "settling down" of the phosphors contained therein.

Settling can occur in conventional components over time where encapsulant is individually applied over a plurality of LED chips prior to curing. Thus, batch encapsulation can advantageously result in quicker processing times, contributing to higher production yields, lower production cost, and higher brightness within devices singulated from substrate 12 (50, FIG. 5). Batch encapsulation can also provide for a stable color targeting and/or stable color across individual devices (e.g., FIG. 5) upon singulation from substrate.

Figure 2B:
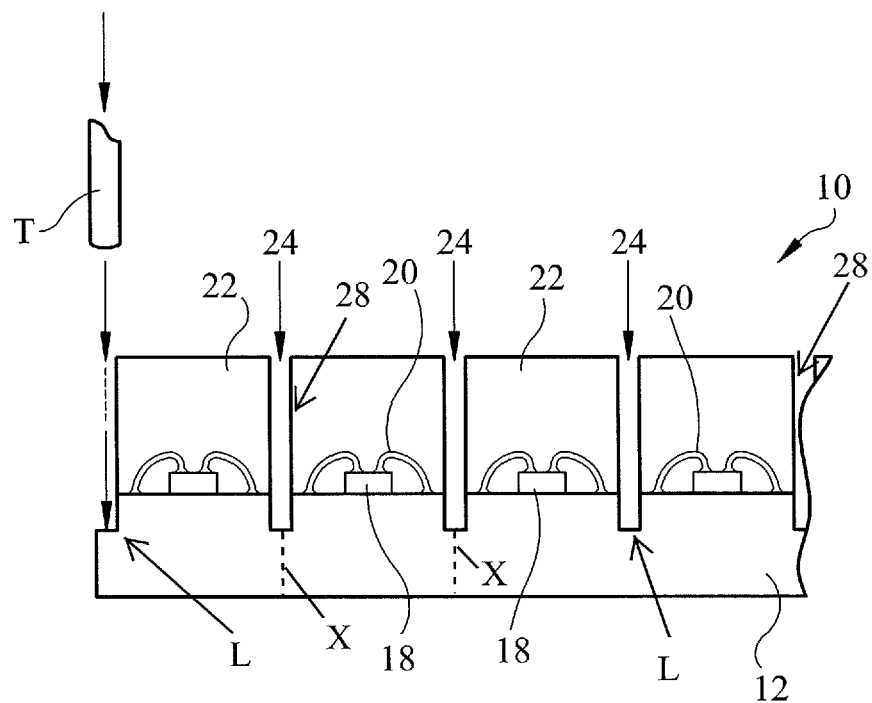

FIG. 2B illustrates another novel aspect of light emitter devices, components, and related methods described herein. As FIG. 2B illustrates, an ablation tool T can be used to ablate material from component 10 after encapsulant 22 has hardened or cured. In some aspects, material of component 10 can be scribed, where ablation tool T can provide scribe marks 24 in portions of component 10. Scribe marks 24 can penetrate and remove portions of encapsulant 22. Notably, scribe marks 24 can also penetrate portions of substrate 12, forming one or more recessed portions or ledges L in substrate 12. In some aspects, ledges L provide a space for one or more portions of reflective material (e.g., a reflector or reflective wall) to be attached as described in FIG. 5. In some aspects, penetration into portions of substrate 12 can result in better adhesion between the reflector or reflective material (26, FIG. 2E) and substrate 12. In some aspects, ablation tool T can form a plurality if trenches, gaps, or scribe marks 24 between adjacent LED chips 18 supported by and/or mounted to substrate 12. Thus, scribe marks 24 can be formed between what will be individual light emitter devices (e.g., 50, FIG. 5), upon singulation.

In further aspects, devices described herein can be devoid of an outer reflector, an outer layer of reflective material, and/or a reflective wall. That is, in some aspects devices can be singulated without using a reflective material, for example, individual devices can be singulated from component 10 along the broken lines denoted X in FIG. 2B. In some aspects, prior to and after singulation, components and devices can comprise an ablated edge, generally designated 28. Ablated edge 28 of devices and components can comprise a portion of encapsulant 22 and a portion of substrate 12, where encapsulant 22 is flush against the surface or side of substrate 12 over which LED chip 18 is mounted. In some aspects, upon singulation lower recessed portion or ledge L of the substrate can extend below ablated edge 28. This can be advantageous as light emitted by LED chips 18 is Lambertian, and therefore when light is emitted below the LED chip 18 it can advantageously be reflected back up and out of the device via the lower ledge L of substrate 12. As noted above, substrate 12 can comprise a highly reflective ceramic material. In some aspects, substrate can comprise a highly reflective white material.

In some aspects, ablation tool T can comprise any suitable tool for removing and/or ablating material. For example, in some aspects ablation tool T comprises at least one dicing blade, a saw blade, a laser tool for laser scribing, or a tool for performing laser ablation technology. Notably, a kerf width of ablation tool T for scribing should be larger than a kerf width of a singulation tool for singulating devices ($T_2$, FIG. 2F). For example, if a singulation tool has a kerf width of approximately 0.2 mm, then the kerf width of ablation tool T should be at least approximately 0.6 mm. In some aspects, the kerf width of ablation T tool can correspond to a width of scribe marks 24. Stated differently, scribe marks 24 can be larger in width, and have more material removed than during singulation of individual packages, which will remove minimal material of negligible width. Ablation tool T can comprise any size and/or shape, and can be configured to provide scribe marks 24 having substantially straight side walls, substantially parallel side walls, or substantially beveled/tapered side walls.

Figure 2C:
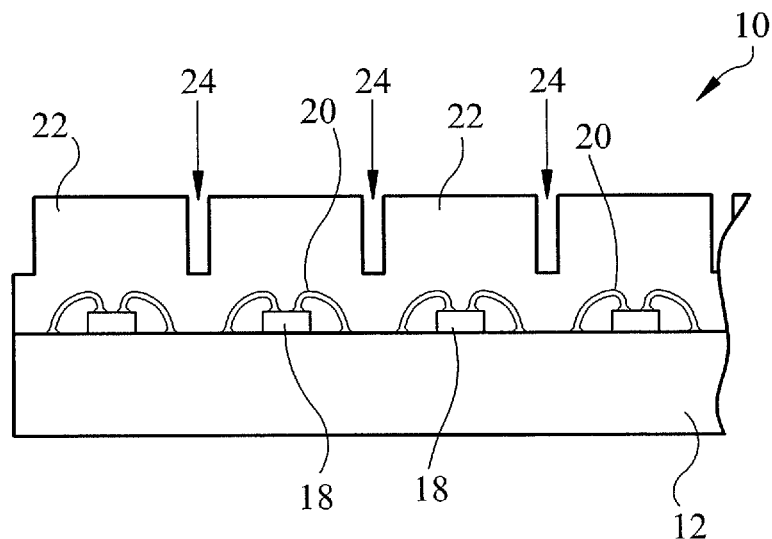

As FIG. 2C illustrates, scribe marks may have a shallower depth than that shown in FIG. 2B. That is, in some aspects scribe marks may only penetrate portions of encapsulant 22 (e.g., cured) and without extending into portions of substrate 12. A depth and/or thickness of scribe marks 24, which can ultimately form side walls of devices upon singulation, can be customized, where desired.

Figure 2D:
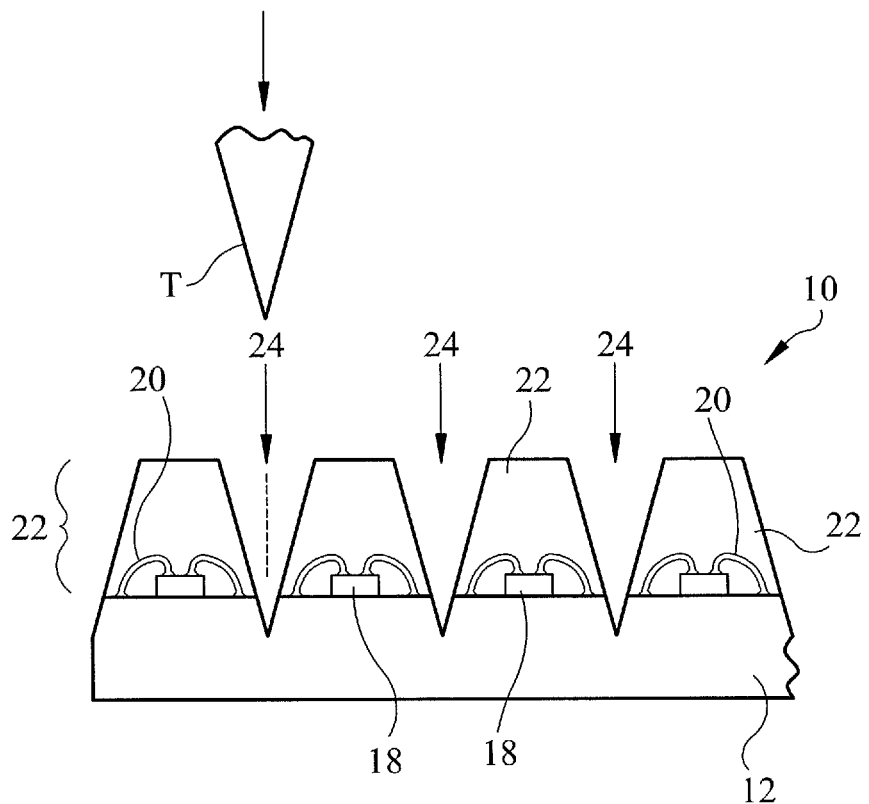

FIG. 2D illustrates an example of an ablation tool T having tapered sides which can provide scribe marks 24 having substantially tapered inner walls. As FIG. 2D illustrates, inner walls of scribe marks 24 can taper inwardly and/or outwardly away from each other forming a substantially V-shaped trench between adjacent LED chips 18. In some aspects, devices having specific beam patterns are desired. This can be achieved in part by providing non-parallel scribe marks 24. Scribe marks 24 can be customized in shape, where desired. In some aspects, scribe marks 24 can be tapered, shaped, partially curved, and/or multi-faceted. Any sectional shape of scribe marks 24 can be produced and is contemplated herein.

In some aspects, individual packages or devices can be singulated from substrate 12 directly after formation of scribe marks 24. In other aspects, scribe marks 24 can be at least partially filled with a reflective material and/or a reflector. That is, scribe marks 24 of component 10 can be at least partially filled and component 10 can be subsequently be diced, sawn, or separated via a laser, for singulation of individual devices (50, FIG. 5) after providing the reflective material.

Figure 2E:
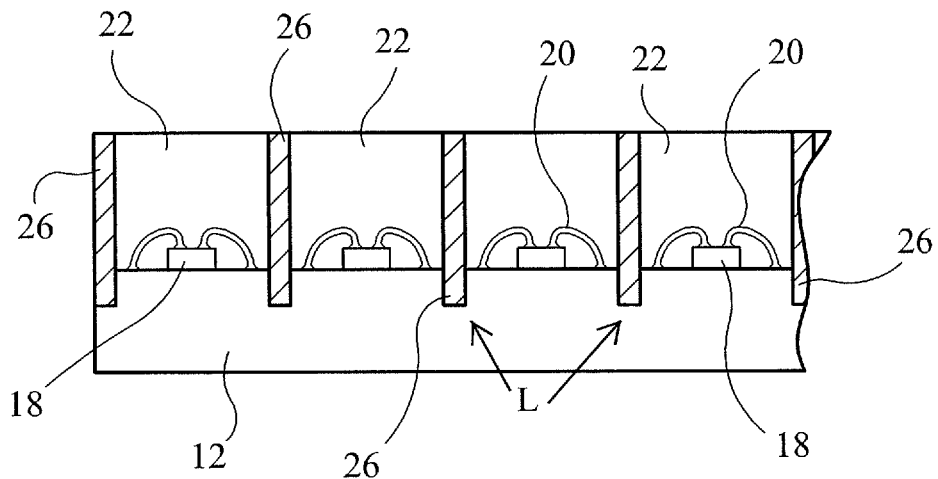

FIG. 2E illustrates an optional step of applying or providing a reflective material 26 and/or a reflector to at least partially or fully fill portions of scribe marks 24. In some aspects, a small wall (e.g., a small amount) of reflective material 26 can be added first via a screen printing process. In some aspects, reflective material 26 can comprise a reflective wall at least partially aligned over and/or attached to recessed portions or ledges L of substrate 12. At least a portion of the reflective material can be disposed above a height or upper surface of LED chip 18 and at least a portion can be disposed below a level, such as the bottom surface level, of LED chip 18. This can be advantageous, as any light emitted below LED chip can be reflected back out via lower portion of material 26. In some aspects reflective material 26 can comprise a highly reflective material which can be white, transparent, optically clear, silver, and/or silver-white in color. In some aspects, reflective material 26 can comprise silicone, a high refractive index silicone material, or any suitable thermoplastic material such as polyphthalamide (PPA), a liquid crystal polymer (LCP), titanium dioxide ($TiO_2$), a silicone having reflective particles dispersed there such as, for example, particles of $Al_2O_3$, $TiO_2$, $BaSO_4$, $ZrO_2$, and/or AlN. In some aspects, a wavelength conversion material such as a phosphor or lumiphor can be contained within reflective material 26. In some aspects, reflective material can comprise a very hard silicone or epoxy, as portions of reflector material 26 can form a side wall of singulated devices (e.g., FIG. 5). In further aspects, filtering particles or materials and/or diffusing particles or materials can be provided within portions of scribe marks 24, such that singulated devices emit filtered or diffused light of any desired wavelength or color point. Notably, reflective material 26 can be customized, where desired, to contain any amount or composition of reflective, wavelength conversion, filtering, and/or diffusing materials.

Where used, wavelength conversion material can be contained either in encapsulant 22 and/or reflective material 24, or both. In some aspects, wavelength conversion material can comprise one or more phosphors or lumiphors (e.g., yellow, red, and/or green phosphor) which can be activated by light emitted from the one or more LED chips 18. In some aspects, wavelength conversion material can be provided when encapsulant 22 and/or reflective material 26 are in liquid form, and can be dispersed therein as such materials harden or cure.

In some aspects, reflective material 26 can be applied in liquid form and allowed to cure or harden. In other aspects, reflective material 26 can comprise a solid material which can be inserted into scribe marks 24, and fixedly held therein via silicone or an adhesive.

Notably, in some aspects, a non-reflective material can be applied in scribe marks 24 over recessed portions or ledges L. The non-reflective material disposed in scribe marks 24 can form a lateral side wall of a device upon singulation, similar to that described in FIG. 5. Notably, the material applied, dispensed, inserted, or otherwise deposited within portions of scribe marks 24 can be customized. In some aspects, the material applied or deposited in scribe marks can be adapted to block light, adapted to absorb light, adapted to filter light, comprise a dichroic filter (e.g., for selectively passing select wavelengths of light), a diffuser, or a material adapted to diffuse light. Any suitable material that can be reflective or non-reflective can be provided in scribe marks 24. In other aspects, scribe marks can be devoid of any material, and devices can be singulated from component 10 after scribing and/or encapsulating. In further aspects, a non-reflective material can be combined with a reflective material and applied or inserted within scribe marks 24 over recessed portions or ledges L.

Figure 2F:
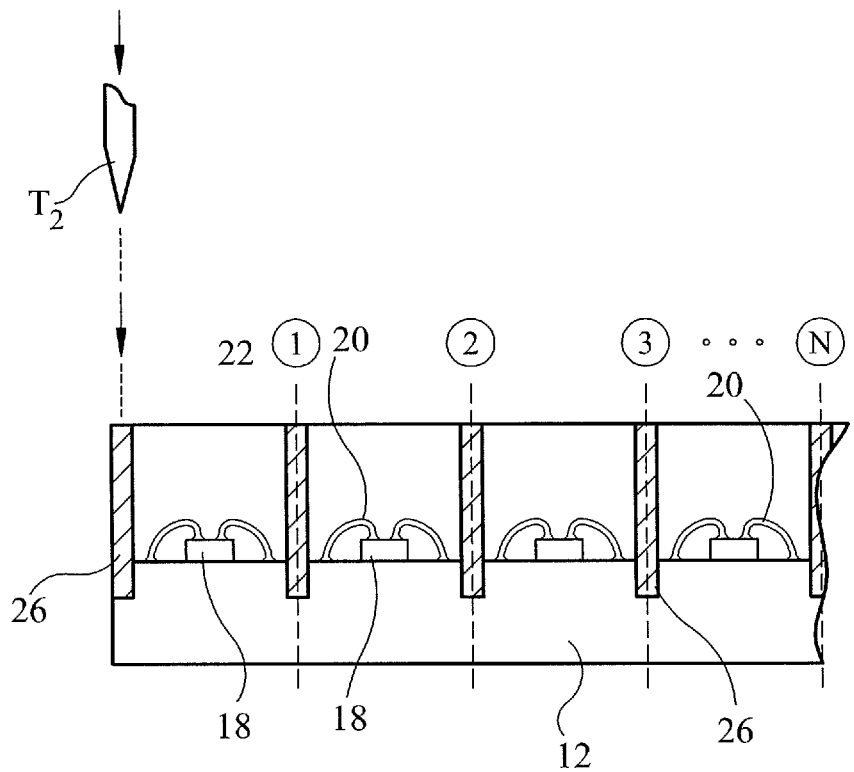

As FIG. 2F illustrates, after insertion of optional reflective material 26, a singulation tool $T_2$ can be used to singulate individual devices along lines designated 1 to N, where N is any integer>1. Singulation tool $T_2$ can comprise a dicing (e.g., saw) blade or a laser tool which can comprise a fine width and/or a smaller kerf width than the width of reflective material 26 and/or scribe marks (24, FIG. 2C). Thus, reflective material 26 can form exterior walls of each device upon singulation. Where reflective material 26 is not used, encapsulant 22 can at least partially form exterior walls of singulated devices. As indicated in FIG. 2D, encapsulant 22 can be provided with shaped walls for producing or shaping light into a desired beam pattern. Singulation tool $T_2$ can be used to singulate individual devices (50, FIG. 5) from component 10, and from large panel substrate 12. For illustration purposes, singulated light emitter devices (50, FIG. 5) are shown as containing one LED chip 18, however, devices containing two or more LED chips 18 are also contemplated and can be provided herein and subjected to batch encapsulation and/or any other substrate based batch processing techniques described herein.

As noted above, the broken lines along and through substrate 12 in FIG. 2F indicate lines along which component 10 can be scribed, sawn, cut, etched, broken, and/or otherwise physically separated, for providing or forming individual packages or devices (e.g., 50, FIG. 5). Individual substrate based packages or devices can be customized with respect to the size, shape, or number of LED chips 18, the shape of exterior walls and/or shape of encapsulant 22, a number of encapsulant 22 layers, materials provided within encapsulant 22 and/or reflective material 26. In some aspects, component 10 and resultant devices described herein can be devoid of reflective material 26. Notably, components described herein can provide customized devices that are substrate based and can be provided at improved costs, lower processing times, fewer processing steps, and/or via batch processing techniques.

Figure 3A:
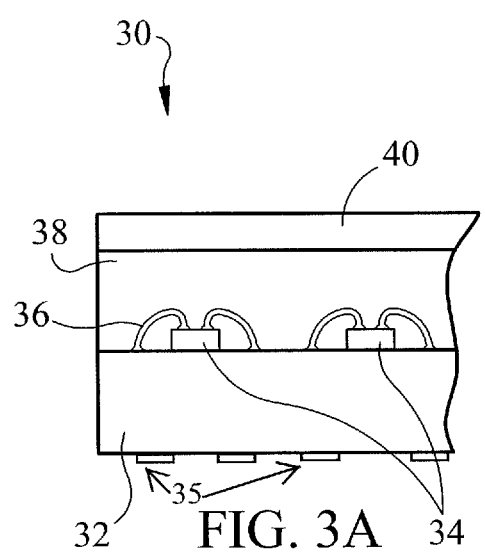
FIGS. 3A to 3E are side views illustrating portions of substrate based light emitter devices and components according to aspects of the disclosure herein.

FIGS. 3A to 3E illustrate another substrate based component, generally designated 30. Component 30 can be similar to component 10, however, FIGS. 3A to 3E illustrate different aspects and/or features associated with components and devices provided herein. FIG. 3A illustrates component 30 comprising a substrate 32, a plurality of LED chips 34 disposed over substrate 32, and the plurality of LED chips 34 being wirebonded to traces (FIG. 1B) via wirebonds 36. Traces can be present in device 30 but may not be visible in the side views; as such features can be very thin compared to substrate 32. A plurality of pairs of bottom contacts 35 can be disposed over a backside or bottom surface of substrate 32. In some aspects, bottom contacts 35 can comprise a metal or metal alloy. In some aspects, bottom contacts 35 can be configured for surface mounting and/or directly connecting to and/or electrically and thermally connecting with external heat sinks or circuit components such as a PCB or a MCPCB (not shown). In some aspects, bottom contacts 35 can electrically communicate with traces using vias (e.g., conduits) through substrate 32. Substrate 32 can comprise a panel substrate of material. In some aspects, it is desirable to provide a substrate 32 that is highly reflective to visible light (e.g., greater than about 90%), and which can provide conduction of heat as well provide as mechanical support. In some aspects, non-metallic and/or ceramic (e.g., HTCC and LTCC) materials containing $Al_2O_3$ exhibit such desirable qualities. Accordingly, substrate 32 can comprise a ceramic based body of material such as $Al_2O_3$ and/or containing $Al_2O_3$. However, metallic, composite, plastic, and flame retardant substrates 32 can also be provided.

In some aspects, substrate 32 can comprise a ceramic body that can be cast from LTCC materials or HTCC materials and/or using related processes. In one embodiment, substrate 32 can be cast from a thin green ceramic tape and subsequently fired. Where used, the ceramic tape can comprise any ceramic filler material known in the art, for example, substrate 33 can comprise a glass ceramic, such as $Al_2O_3$ or AlN having 0.3 to 0.5 weight percent of glass frits, as described above. The glass frits can be used as a binder and/or sintering inhibitor within the ceramic tape when the tape is fired.

In some aspects, substrate 32 can be produced by thin- or thick-film processing techniques available at and including products available from CoorsTek, headquartered in Golden, Colo. Such substrates 32 can optionally be fired along with other materials (e.g., zirconia, $ZrO_2$) to further improve optical and mechanical properties.

In some aspects, LED chips 34 can be mounted (e.g., die attached) over substrate 32 after firing and/or sintering. LED chips 34 can be die attached using any suitable material capable of causing LED chips 34 to adhere to substrate 32. For example, LED chips 34 can be die attached using solder, epoxy, paste, glue, silicone, flux materials, eutectic materials, or any other suitable adhesive materials.

Still referring to FIG. 3A, LED chips 34 can be electrically connected to traces via wirebonds 36 proximate a same time. LED chips 34 can also be encapsulated proximate a same time via a batch encapsulation process as previously described. An encapsulant 38 can be applied via spraying, dispensing, or using one large, single mold. In some aspects, encapsulant 38 can form a continuous layer over LED chips 34, wirebonds 36, traces (e.g., FIG. 1A, may not be visible in side view) substrate 32, and bottom contacts 35. Encapsulant 38 can be devoid of a phosphor, or one or more phosphors can be dispersed within encapsulant 38. More than one layer of encapsulant 38 can be provided. In some aspects, a phosphor layer can be sprayed or applied to component 30 prior to encapsulation, where desired.

Notably, a tape, mask, or masking layer can be applied after formation an initial layer of encapsulant. That is, a mask 40 can be applied over encapsulant 38 after encapsulant has been allowed to harden or cure. In some aspects, mask 40 can be formed and/or applied via hot lamination technology. In other aspects, mask 40 can comprise a polymer tape, a sticker, or an adhesive material. Mask 40 can comprise any polymer material such as polyimide (PI), with or without adhesive materials. Mask 40 can be adapted to provide a barrier over encapsulant 38 during subsequent processing steps, and can provide a place holder for one or more subsequent layers applied over encapsulant 38. In some aspects, the subsequent layer(s) may be brittle and/or susceptible to peeling or degrading during scribing. In other aspects, mask 40 can assist and/or improve application of reflective layer 44 as described below.

Figure 3B:
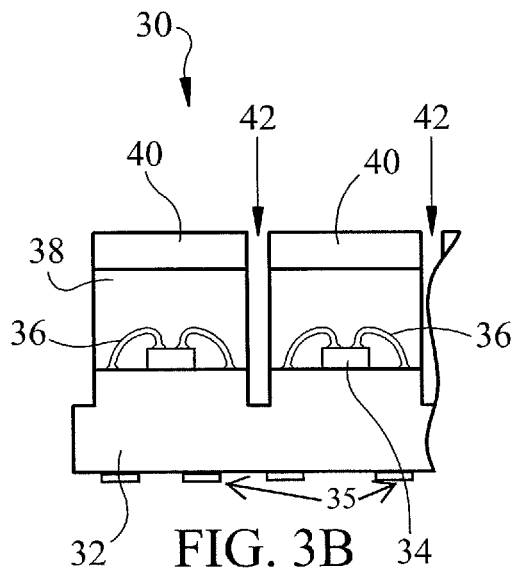
Figure 3C:
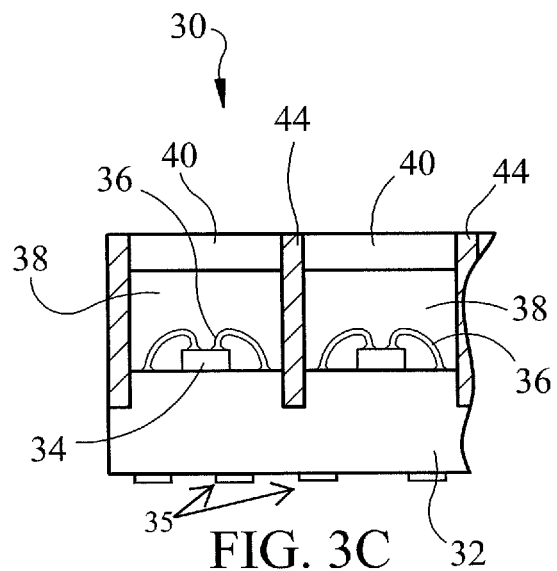

As FIG. 3B illustrates, one or more scribe marks 42 can be provided in portions of mask 40. Scribe marks 42 can penetrate portions of encapsulant 38 and optionally portions of substrate 32. Scribe marks 42 can be formed with a saw blade, a laser beam, or using any other dicing, separating, or ablation techniques.

FIG. 3A illustrates formation and/or application of a reflective material 44 within previously provided scribe marks. In some aspects, reflective material 44 can completely fill the area created by scribe marks. In other aspects, reflective material 44 can only partially coat portions of scribe marks (e.g. FIG. 4A). In further aspects, more than one reflective material 44 can be applied within scribe marks 42.

In some aspects, provision of reflective material 44 (or optionally a filter material or diffusing material) can also be performed via a batch process, where multiple reflective walls can be created, provided, or established at a same time. For example, in some aspects mask 40 can prevent filling material from being disposed over, from sticking to, and/or from being adhesively applied over portions of encapsulant 38. For example, mask 40 can be applied over encapsulant 38 after encapsulant 38 has hardened. After scribing (e.g., FIG. 3B), component 30 can be placed under a vacuum. Silicone or other reflective material 44 can be applied over entire component 10, and a vacuum can be applied. The silicone or reflective material 44 can flow into and fill scribe marks 42 via capillary action. Thus, reflective material 44 can be applied over entire component (e.g., as a batch) and a vacuum can be used to pull, place, or cause material 44 to become disposed within portions of scribe marks (42, FIG. 3B).

Figure 3D:
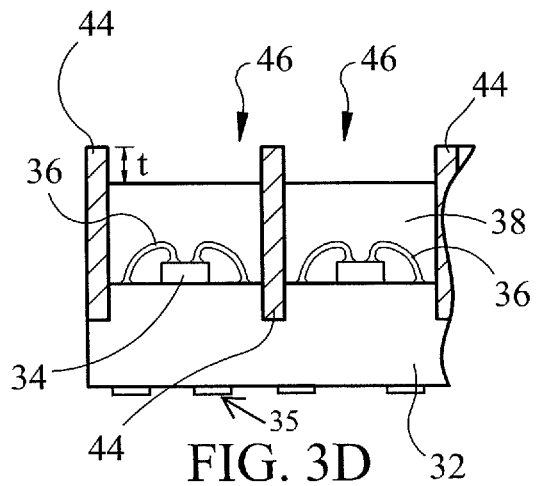
Figure 3E:
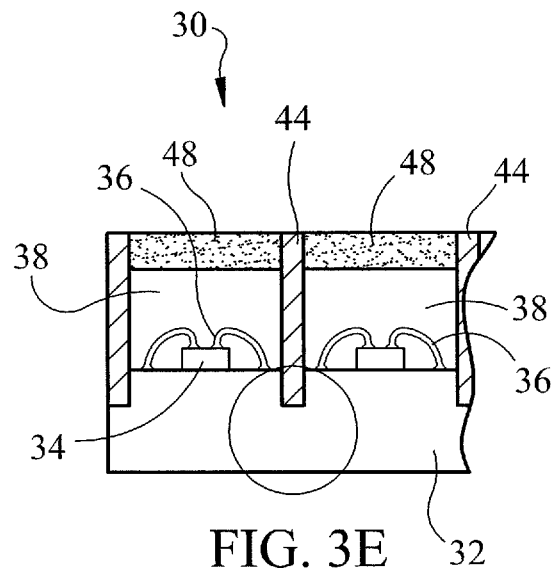

As FIG. 3D illustrates, mask 40 can be removed after optional formation of side walls comprised of reflective material 44. One or more gaps 46 having a thickness t can be provided upon removal of mask 40. As FIG. 3E illustrates, a second layer of material 48 can be provided in gaps 46 (FIG. 3D). Second layer of material 48 can comprise an optically clear layer of material, or it can contain one or more phosphors, filtering materials, reflective materials, scattering material, or diffusing material as denoted by the shaded appearance. Second layer of material 48 can be the same material as encapsulant 38 or second layer of material 48 can comprise a different material or materials than encapsulant 38. Notably, second layer of material 48 can be sprayed, dispensed, or applied to component 30 at a same time and over the multiple LED chips 34 as a batch or in a batch application or process. Application of multiple sections of second layer of material 48 at the same over component 30 can advantageously be performed in less time than application of multiple single portions. The decreased processing time can be advantageous as phosphor, where used within layer 48, can be prevented from settling over time.

In some aspects, LED chips 34 can be configured to activate a yellow, a red, a blue, and/or green phosphor (not shown) disposed either directly over each LED chip 34, disposed within reflective material 44, disposed within encapsulant 36, and/or disposed within second layer of material 48 for producing neutral, cool, and/or warm white output. Single or multiple LED chips 34 can be used alone or in combination with devices and components described herein.

As noted above with respect to FIG. 3C, reflective material 44 can be configured to fully fill scribe marks (42, FIG. 3B) or only partially fill scribe marks 42. FIGS. 4A to 4D illustrate various configurations of reflective material within scribe mark 42. Notably, the placement, amount, thickness, concentration, and/or other aspects pertaining to reflective marital 44 can be customized in some aspects.

Figure 4A:
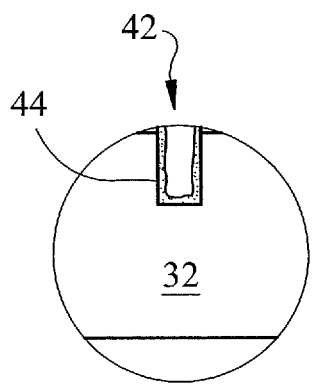
FIGS. 4A and 4D are side views illustrating portions of substrate based light emitter devices and components according to aspects of the disclosure herein.
Figure 4B:
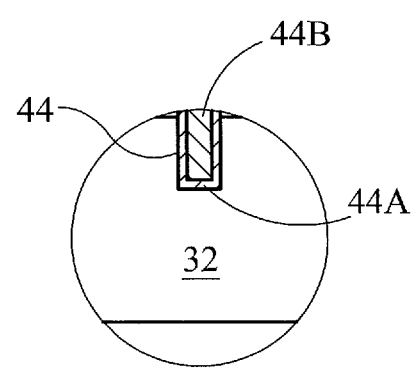

As FIG. 4A illustrates, in some aspects reflective material 44 can be configured to coat only a portion of scribe mark 42. Reflective material 44 can comprise a thin layer and may contain a phosphor or phosphors, scattering particles, diffusing particles, filtering particles, etc. As FIG. 4B illustrates in some aspects, reflective material 44 can comprise more than one portion, layer, or material. That is, reflective material 44 can comprise a composite layer or structure. A first layer of reflective material 44A can comprise a coating applied over inner walls of and/or a bottom surface of scribe mark. A second layer of material 44B, can be applied inside of and/or adjacent first layer 44A. In some aspects, second layer of reflective material 44B can be at least partially nested in first layer of reflective material 44A. The materials forming the first and second layers 44A and 44B can comprise multiple layers of a same material, or layers 44A and 44B can comprise different materials. More than two layers and/or materials are also contemplated. In some aspects, more than two layers of material can be vertically stacked within scribe marks. Material 44 can comprise any material(s), any number of layers, and any configuration. Notably, reflective material 44 can be varied, and therefore, can provide easy to manufacture customized devices at a lower cost than other known devices.

Figure 4C:
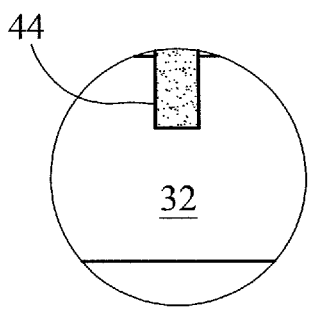
Figure 4D:
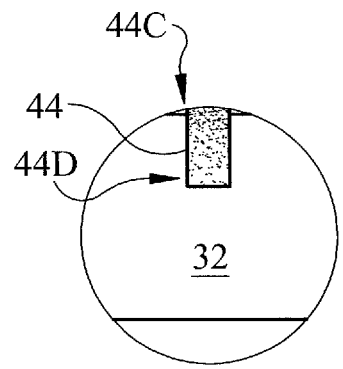

As FIG. 4C illustrates, in some aspects reflective material 44 can comprise a single layer having a substantially uniform amount of reflective particles and/or phosphor materials disposed therein as indicated by the shading. As FIG. 4D illustrates a concentration of reflective particles and/or phosphor materials can be varied. As FIG. 4D illustrates, a more dense region 44C of phosphors or particles can be applied over a less dense region 44D. Concentrations can be varied along a length of reflector material 44 to provide any desired light output, color point, and beam shape.

In some aspects, phosphors disposed within reflective material can comprise phosphors or lumiphors (e.g., yellow, red, blue, and/or green phosphor) which can be activated by light emitted from the one or more LED chips 34 (FIG. 3E). In some aspects, wavelength conversion material (e.g., phosphor) can be provided when reflector material 44 is in a liquid form, and can be uniformly or non-uniformly dispersed therein. After application, reflector material 44 can be allowed to harden and cure. After hardening, reflector material 44 and substrate 32 can be diced and individual packages or devices can be singulated.

FIG. 5 illustrates a light emitter device generally designated 50, which can be provided and produced according to components and methods described herein. For example, when component 10 is singulated or diced along broken lines (FIG. 2F), multiple singulated packages or devices 50 can be provided. Singulated device 50 can be substrate based, that is, fully processed over a large panel substrate 12 (FIG. 1A) and then subsequently singulated into individual devices 50 over individual smaller portions of substrate 12. In some aspects, a plurality of devices can be die-attached, wirebonded, and encapsulated as a batches for reducing processing times and lowering production costs. This has also unexpectedly led to a significantly more stable color point for individual devices singulated from components described herein, as the reduced processing times prevent sticking of the encapsulant and/or prevent settling of phosphors contained within the encapsulant.

As FIG. 5 illustrates, reflective material 26 can comprise a reflective lateral side wall of device 50. Reflective material 26 can be at least partially disposed in and on recessed portion or ledge L of the substrate 12. The ledge L can be provided below a level of LED chip 18. In some aspects, a first portion of the reflective lateral side wall or reflective material, denoted 46' can be disposed above a height of LED chip 18, and a second portion of the reflective material denoted 46" can be disposed below a level of LED chip 18, and flush against ledge L. This can be advantageous, as LED chips 18 can emit Lambertian patterns of light, thus, any light emitted below LED chip can be reflected back out via lower portion of material 46". Notably, such device can comprise minimal features batch processed in minimal steps, resulting in a superior, improved lighting device.

In some aspects, LED chips 18 can be configured to activate a yellow, a red, a blue, and/or green phosphor (not shown) disposed either directly over each LED chip 18, disposed within encapsulant 22, and/or disposed within reflective material 26 for producing neutral, cool, and/or warm white output. For illustration purposes only, one LED chip 18 is indicated per device 50. However, two or more LED chips 18 can be provided in one device 50. Where multiple LED chips 18 are used in device 50, each can comprise a same color. In other aspects, each LED chip 18 can comprise a different color selected from the group of blue, blue shifted yellow (BSY), cyan, green, red, yellow, red-orange, or amber. Any color and/or colors of LED chip 18 can be provided.

In some aspects, LED chips 18 can be primarily blue and configured to activate a yellow phosphor. In other aspects, LED chips 18 can be primarily red. LED chips 18 can be used together within device 50, for example, a primarily blue LED chip or chips 18 can be used in combination with a primarily red LED chip or chips 18. In some aspects, a primarily red LED chip 18 can be disposed below a phosphor (e.g., sprayed over chip or disposed within encapsulant or reflective material) for mixing with light of other LED chips and/or phosphors to produce warm white output.

Notably, in some aspects encapsulant 22 does not require molding. That is, in some aspects, encapsulant 22 can comprise a silicone matrix, encapsulant, or plastic material which can be deposited or dispensed directly over substrate 12 over entire component and over multiple devices at approximately the same time. In some aspects, a single large mold can be used. In other aspects, encapsulant 22 can be dispensed or sprayed. Thus, encapsulant can be provided as a batch over devices 50, prior to singulation, without the time or expense of having to overmold multiple lenses.

FIGS. 6A and 6B illustrate further light emitter packages or devices, generally designated 60, which can be produced from components and related methods described herein. Device 60 can be processed over a large panel substrate 62 and individually singulated at the end of a process via dicing, sawing, breaking, using a laser beam, etc. Device 60 can comprise an LED chip 64 electrically connected to one or more vias 68 using wirebonds 66. As discussed above with respect to FIG. 1A, multiple vias 68 can be provided in a component substrate 62, prior to singulation of the component substrate 62 into multiple devices. At least one electrical trace 70 can be optionally plated over vias 68.

FIG. 6B illustrates a backside of device 60, which opposes the side to which LED chip 64 is attached. Notably, in some aspects first and second bottom contacts 72 and 74 can be applied to a bottom surface of substrate 62 prior to singulation. First and second bottom contacts 72 and 74 can connected to upper traces 16 (e.g., FIG. 1B) using vias, wrap-around (side) traces or contacts, flexible circuitry, or any other desired configuration. First and second bottom contacts 72 and 74 can transmit electrical current into top traces using vias 68, which can transmit electrical current into LED chip 64 via wirebonds 66.

In some aspects, a plurality of bottom contacts can be applied as a batch over substrate 62 using a mask (M, FIG. 1B), stencil, etc., similar to applying traces 16 (FIG. 1B), as previously described. In some aspects, bottom contacts 72 and 74 can comprise a metal or metal alloy. In some aspects, light emitter device 60 can comprise a substrate based device configured for surface mount device (SMD) applications. SMDs can comprise at least two bottom contacts for directly connecting to and/or electrically and thermally connecting with external heat sinks or circuit components such as a PCB or a MCPCB. In some aspects, device 60 can be singulated from a large a non-metallic substrate, similar to previously described substrate 12 (FIG. 1A). In some aspects, substrates according to any of the previously described embodiments can have a desirable thermal conductivity. For example and without limitation, substrates described herein can comprise a thermal conductivity of greater than 5 W/mK, greater than 10 W/mK, greater than 50 W/mK, greater than 100 W/mK, greater than 150 W/mK, or greater than 200 W/mK. In more particular aspects, the thermal conductivity of the substrate can be approximately 20 W/mK (+ or −5 W/mK), such as for when the substrate comprises alumina, or the thermal conductivity of the substrate can be approximately 170 W/mK (+ or −5 W/mK), such as for when the substrate comprises AlN. In alternative aspects, metallic, polymeric, plastic, or composite substrates can be provided.

As FIG. 6B illustrates, in some aspects, first and second bottom electrical contacts 72 and 74 can electrically communicate to respective LED chip 64 using one or more internally disposed thru-holes or vias 68. Vias 68 can extend internally within a portion of substrate 62 depending on how placed within panel (e.g., FIG. 1A) and how panel is subdivided into individual devices. For example, vias 68 can be fully internal to, intact, and/or fully contained within portions of substrate 62 as shown, or in other aspects, vias 68 can be apportioned and exposed such that they are disposed along one or more external sides of substrate 62. Vias 68 can comprise conduits for transferring electrical current about substrate and into respective LED chip 64 within devices 60.

In some aspects, first and second electrical contacts 72 and 74 can be deposited via electroplating and/or electroless plating processes. In some aspects, first and second electrical contacts 72 and 74 can comprise one or more layers of material, such as one or more layers of Au, Sn, Ti, Ag, Cu, Pd, ENIG, and/or any alloy or combination thereof. First and second electrical contacts 72 and 74 can also be deposited via physical deposition methods, sputtering, screen-printing, and/or any other methods previously described above.

Notably, first and second electrical contacts 72 and 74 can comprise different sizes and/or shapes. For example, in some aspects first electrical contact 72 can comprise a V-shaped notch for indicating electrical polarity. In some aspects, the V-shaped notch indicates a cathode. In other aspects, the V-shaped notch can indicate an anode. Thus, time and expense associated with otherwise marking the component (e.g., via scribing, notching, etc.) can be obviated.

In some aspects, top trace 70 (FIG. 6A) and/or first and second electrical contacts 72 and 74 can comprise metallic bodies or portions of material that can be attached to substrate 62 via adhesive, solder, glue, epoxy, paste, silicone, or any other material. Substrate 62 can comprise ceramic, metallic, polymeric, composite, FR4, or any other suitable substrate having traces attached thereto. In further aspects, top trace 70 and first and second electrical contacts 72 and 74 can comprise metallic bodies or portions of material that can be pressed into a green ceramic tape and then co-fired with substrate 62, as a batch (e.g., as an un-singulated substrate panel, FIG. 1A). In yet further aspects, first and second electrical contacts 72 and 74 and/or top trace 70 be applied via a conductive paste screen-printed over an HTCC or LTCC panel substrate and fired. In some aspects, a conductive Ag paste can be used such as silver paste #7095 available from DuPont Electronics.

In some aspects, first and second electrical contacts 72 and 74 can be mounted over and electrically or thermally communicate with an external heat sink or power source (not shown). In some aspects, first and second electrical contacts 72 and 74 can be configured to pass electrical signal or current from the outside power source (not shown) such as a circuit board, a PCB, a MCPCB, or other electrical source into the one or more LED chips 64 by passing electrical current about or through substrate 62 using vias 68.

Portions of first and second electrical contacts 72 and 74 can be soldered, welded, glued, or otherwise physically, electrically, and/or thermally attached to the external power source (not shown). LED chips 64 can illuminate upon receiving electrical current passed between respective top and bottom electrical contacts or traces.

In some aspects, singulated devices can have a submount or substrate 62 having a length and a width of approximately 5 mm×5 mm or less, approximately 4 mm×4 mm or less, or approximately 3 mm×3 mm or less. In some aspects, however, any customized size of device having any number of LED chips 64 can be provided Although not shown, device 60 can comprise an optional reflector (e.g., 26, FIG. 5) and an optical element including one, two, or more than two layers of encapsulant (22, FIG. 5). Notably, the technology described herein allows for a substantially flat panel substrate to be formed into a multitude of different and/or customized packages or components without having to incur expenses associated with custom fabricated packages. Notably, this technology also allows for provision of optical elements or encapsulant which do not require formation of and/or individually molding such components. Notably, varying the size, shape, number, placement, and/or location of any one of the traces, vias 68, LED chips 64, reflectors, and/or layers/composition of encapsulant can allow for a multitude of differently sized, shaped, and/or customized color components and devices to be formed over substrates described herein. In addition, as noted above, one or more optional ESD protection devices can be provided in any configuration over devices and components described herein, where desired.

Figure 7:
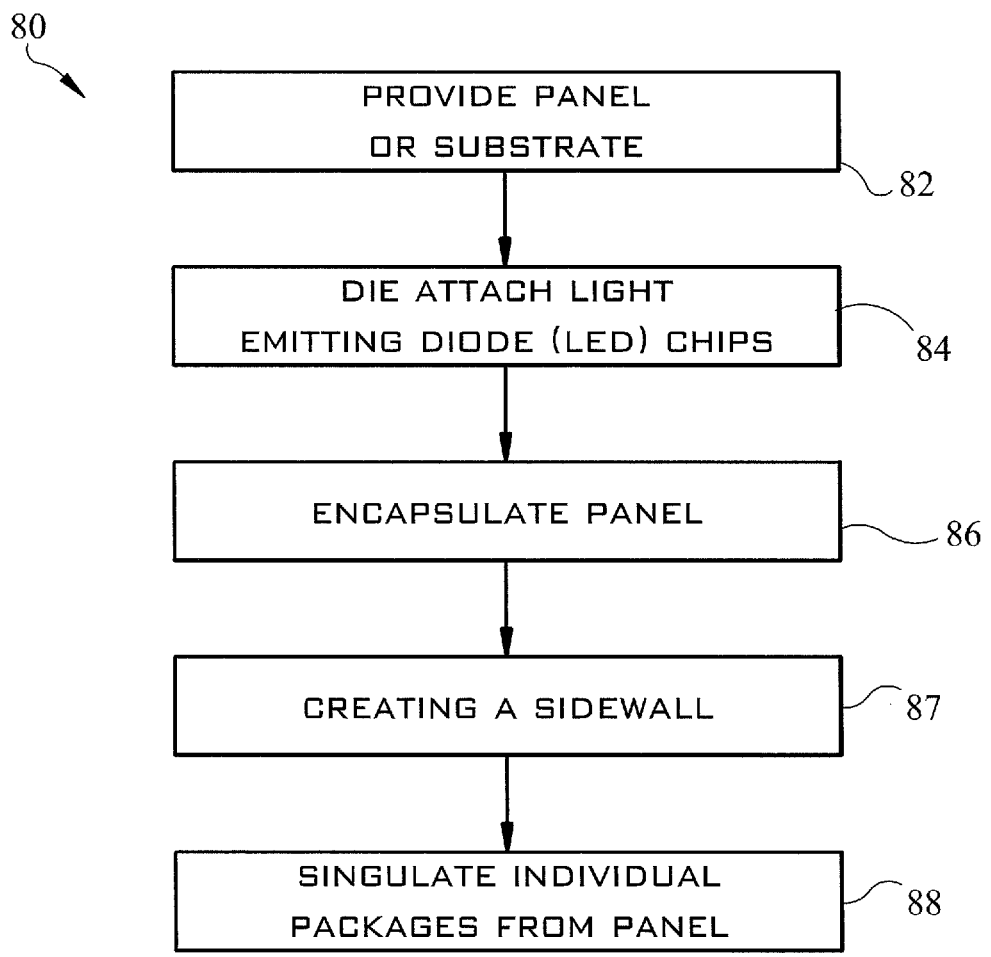
FIG. 7 is a flow chart illustrating exemplary steps for providing substrate based light emitter devices and components according to aspects of the disclosure herein.

FIG. 7 is a flow chart 80 illustrating exemplary steps that can be utilized for providing substrate based light emitter components and devices according to the disclosure herein. Step 82 comprises providing a panel or substrate. Substrate can comprise any size or dimension and any shape. In some aspects, substrate can be contained on a reel, and devices can subsequently be built (e.g., batch processed) and singulated therefrom. Substrates described herein can comprise any suitable size, shape, and/or thickness, and such dimensions can be customized where desired. As described herein, the substrate can comprise a metallic, plastic, polymeric, composite, flame retardant (e.g., FR-4), non-metallic, or ceramic material. Combinations of such materials can also be used and provided as a substrate.

In some aspects, providing a highly reflective, white, substantially non-absorbing substrate is desired. In some aspects, a ceramic substrate is desired. In some aspects, substrates provided herein can comprise AlN or $Al_2O_3$. In some aspects, a substrate that is approximately 2 inches ("")×4" can be provided such that approximately 420 devices (e.g., having a substrate of approximately 3 mm×3 mm) can be formed or singulated therefrom. In other aspects, a size of individual devices singulated therefrom can be customized.

One or more optional steps can be performed after provision of a panel or substrate. For example, one or more vias can be formed in the substrate and multiple traces or contacts can be formed on opposing surfaces. In some aspects, top traces and bottom contacts can be provided via sputtering, plating, masking, screen-printing, stenciling, physical deposition, or electroless deposition techniques.

In step 84, a plurality of light emitter chips, such as LED chips, can be provided over substrate and die attached thereto. LED chips can comprise any size, shape, build, structure, number, and/or color. In some aspects, a plurality of LED chips can be provided in an array over the panel. In some aspects, at least one LED chip can be provided between at least two formed vias and/or between at least two traces. In other aspects, each LED chip can be directly attached over vias and/or traces. In some aspects, each LED chip can be attached to the substrate via a bonding material such as one comprising epoxy, silicone, solder, flux, paste, etc., or combinations thereof. In some aspects, step 84 can be repeated for die attaching optional ESD chips, where desired.

Notably in some aspects, a plurality of devices can be provided over the substrate. The plurality of devices can each include die attached LED chips provided in step 84. The devices can further comprise traces and/or bottom contacts adapted to be surface mounted to an external heat sink or substrate (e.g., MCPCB or PCB).

After performing step 84, the LED chips and/or ESD chips can be wirebonded to traces, such as deposited electrical contacts or exposed metallic vias. In other aspects, direct attached LED chips can be provided or mounted directly over traces such that wirebonds are not required. In some aspects, wirebonds can comprise a positive loop which curves upwardly between LED chip and traces. In other aspects, wirebonds can comprise a negative loop which curves at least partially downwards between LED chips and traces.

In step 86, the panel or substrate can be encapsulated such that each LED chip is encapsulated as a batch. In some aspects, a top surface of the panel or substrate can be encapsulated. Encapsulant can be sprayed, dispensed, molded via a large mold, etc., such that the need to individually mold one lens over each LED chip is obviated. Encapsulant can be applied in one or more layers. In some aspects, a phosphor can be sprayed or applied over LED chips and/or portions of components prior to encapsulating. In other aspects, encapsulant can comprise one or more phosphors. The number of layers and composition of encapsulant can be customized depending upon a desired color point. In some aspects, encapsulant can comprise reflective particles, filtering materials, or diffusing materials, where desired. The encapsulant can subsequently be hardened or cured.

In step 87, a lateral side wall can be created, and can comprise either ablating or scribing material (e.g., substrate only, encapsulant only, or a combination thereof, or any other portion of components described herein) from a front side or a back side.

One or more optional steps can be performed after the encapsulation has hardened. In some aspects a tape or mask can be applied prior to scribing. In some aspects, the substrate based component can be scribed through a portion of the encapsulant, through a portion of the optional tape or mask, and optionally through a portion of the substrate.

In addition to scribing, a reflective material can, but does not have to be provided in the trenches or scribe marks resultant from scribing. The reflective material can include reflective particles, filtering particles, diffusing particles, or phosphoric material(s). The reflective material can be dispensed or applied as a batch over the substrate component using a vacuum where a tape or mask is used. In other aspects, reflective material can be dispensed or coated within scribe marks.

In step 88, individual packages or devices can be singulated from the panel or substrate into individual substrate based devices for example, by sawing, cutting, shearing, dicing, or breaking portions of the substrate component. In some aspects, singulating individual packages or devices can comprise sawing through a portion of the reflective material, providing an exterior, lateral side wall comprised of reflective material. In other aspects, the substrate can be sawn through or otherwise singulated, as a reflective side wall is not required. In some aspects, the encapsulant can be formed via tapered blades, which are not bounded or encased by a portion of the reflective material. In other aspects, the reflective material can at least partially harden about encapsulant and/or other phosphoric layers. In some aspects, the panel can be singulated along lines substantially orthogonal to a longitudinal axis or centerline of the panel.

Figure 8:
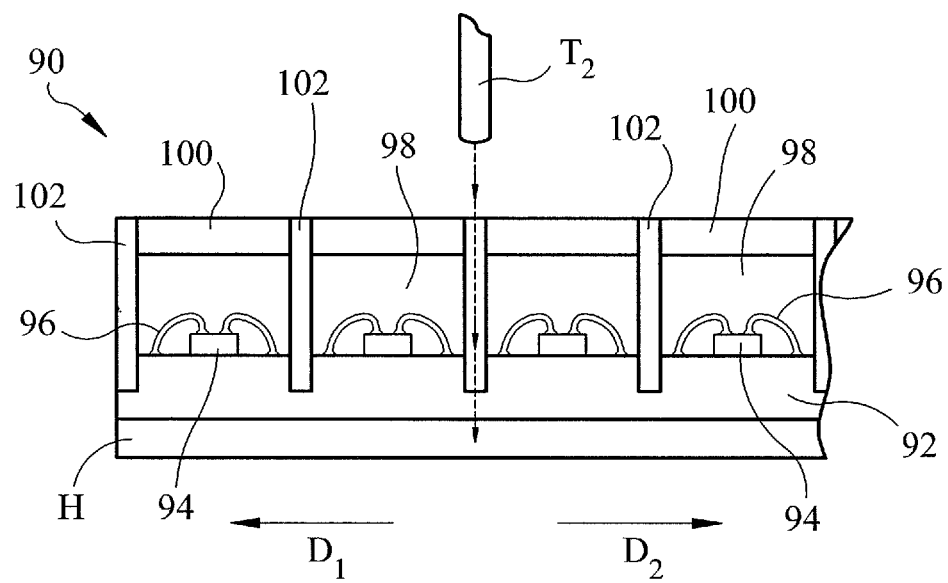
FIG. 8 is a side view illustrating portions of substrate based light emitter devices and components according to aspects of the disclosure herein.

FIG. 8 illustrates further aspects of components and devices described herein. As FIG. 8 illustrates, a light emitter component 90 can comprise a substrate 92 provided over a carrying member or substrate holder, H. In some aspects, holder H comprises a layer of tape. LED chips 94 can be electrically attached to traces (not shown) disposed over substrate 92 via wirebonds 96. Multiple encapsulant layers 98 and 100 can be provided over LED chips as desired. Reflector walls 102 can be provided, where desired. A singulation tool $T_2$ can be used to singulate individual packages or devices from component 90. Notably, singulation tool $T_2$ can cut through the substrate 92 into a portion of holder H. Singulation tool $T_2$ can at least partially cut into holder H, but may not fully penetrate holder H.

Holder H can then be stretched or pulled in directions D1 and D2. The substrates can be easily separated from each other when holder H is stretched, and can also be easily separated from holder H. In this aspect, singulation tool $T_2$ can also be used to provide an easier method of removal.

Figure 9:
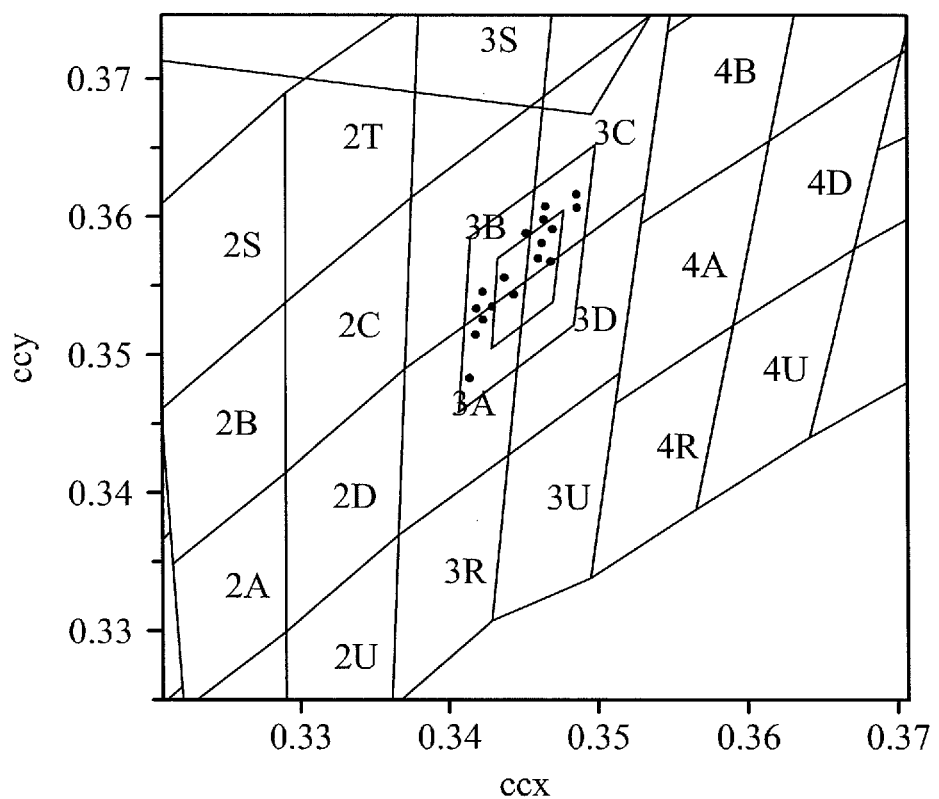
FIG. 9 is a graphical illustration of exemplary color targeting and color consistency associated with substrate based light emitter devices and components according to aspects of the disclosure herein.

FIG. 9 is a graphical illustration of exemplary optical properties associated with substrate based light emitter devices and components according to aspects of the disclosure herein. FIG. 9 illustrates how superior color control can be achieved via devices singulated from a batch processed component. FIG. 9 is a graph of white chromaticity regions plotted on the CIE 1931 Curve. The targeted color bins are indicated in diamonds. As the plotted data points, indicated as dots, in FIG. 9 illustrate, devices singulated from a single component can comprise a tight, stable, and consistent color range. This is also possible across other chromaticity bins, and is not limited to the 3A to 3D bins which are consistent with a color temperature of about 5000 K.

Figure 10:
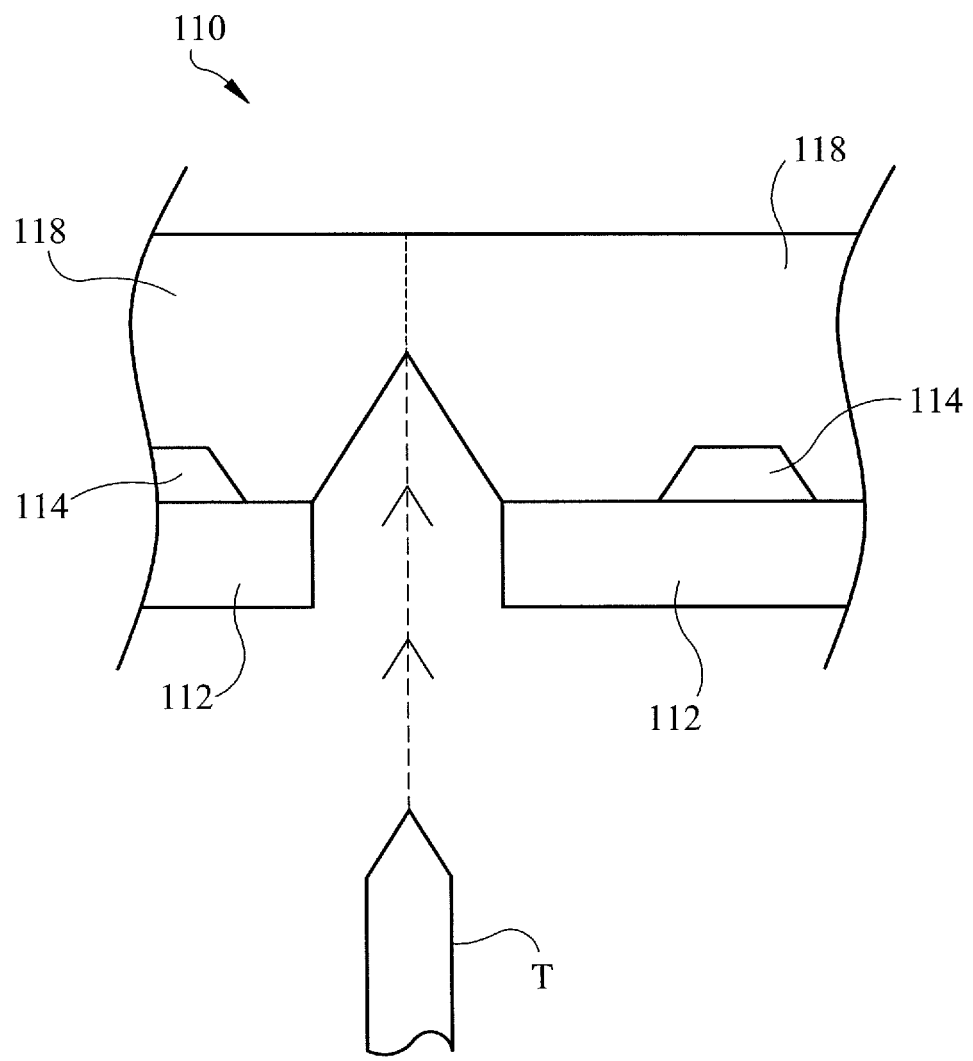
FIG. 10 is a further embodiment of substrate based light emitter devices and components according to aspects of the disclosure herein.

FIG. 10 illustrates a further embodiment of substrate based light emitter devices and components according to aspects of the disclosure herein. As discussed in FIGS. 2B to 2D hereinabove, side walls can be created via scribing and/or ablating material from a front side of a component (e.g., where ablation tool T moves directionally from a front side of substrate component, in a direction from above LED chips). Individual devices can be provided via singulation. The scribe marks can be at least partially coated and/or filled with a reflective material, a light absorbing or blocking material, silicone, a filtering material, phosphor, or any other type of optical madeira can be provided. In some aspects, scribe marks can be left devoid of material. FIG. 10 illustrates creation of side walls and/or scribing a back side of a light emitter component, as opposed to a front side. In some aspects, ablation tool T can move directionally from the back side of substrate component (e.g., opposing a surface upon which LED chips are mounted) in a direction from under or below the LED chips.

That is, as FIG. 10 illustrates, a light emitter component generally designated 100 can comprise a substrate 112 and multiple LED chips 114 disposed over a front surface of substrate 112 as previously described. An encapsulant material 118 can be applied in a single volume over each of the LED chips 114 and substrate 112 portions at a same time in a batch encapsulation step. Notably, ablation tool T can be used to ablate material that is disposed below each LED chip on a back side of substrate 112 that opposes the surface upon which LED chips 114 are mounted. That is, ablation tool T can create a scribe mark extending through portions of substrate 112 and encapsulant. As the broken line indicates, tool T can be used to create a scribe mark of any depth. In some aspects, the scribe mark created by tool T can have tapered walls. In some aspects, the scribe mark can be filled with a reflective, light absorbing, light blocking, light filtering, silicone, or any other type of material desired. In some aspects, the scribe mark created by tool T can be left devoid of any material when singulating individual devices.

Components and devices described herein can be easily produced as the time consuming process and/or additional cost associated with individually molding optical elements and/or dispensing encapsulant over multiple LED chips individually becomes obsolete. Substrate based components can be singulated into a plurality of individual substrate (or submount) based devices by dicing, cutting, sawing, or otherwise separating components along singulation lines (e.g. FIG. 2F) after curing or after hardening of the encapsulant and/or reflective material or reflective side walls. In some aspects, components can be diced and/or singulated in a direction substantially orthogonal to a longitudinal axis of a panel substrate.

Notably, panel substrates can comprise the building blocks of customized SMD type emitter components and devices described herein. For example, in some aspects, single or multi-chip components can be provided, components having any size, shape, and/or pattern of traces can be provided, and components having the same or differently colored LED chips can be provided over and/or around portions of the substrate. Notably, customized packages do not require formation of individual lenses or require individually dispensed encapsulant over the LED chips, which can advantageously reduce manufacturing costs, time, and/or materials associated with providing components and packages descried herein. Notably, a multitude of different customized components can be provided without the expense of creating custom fabricated ceramic components and/or custom molded plastic components. Notably, devices and components described herein can advantageously provide reflective side walls, where desired.

Embodiments as disclosed herein may provide one or more of the following beneficial technical effects: reduced production costs; reduced processing time; stable color targeting; improved manufacturability; improved ability to customize component and/or device features, such as for example, trace design, substrate thickness, number/type/size/color of LED chips, encapsulant layers, reflective material, size/shape of singulated devices, among others.

While the components and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitter device comprising:
   a substrate;
   at least one light emitter chip on a first side of the substrate, wherein the substrate comprises a recessed portion disposed below a level of the light emitter chip;
   a layer of phosphor-containing encapsulant disposed over the at least one light emitter chip; and
   a non-reflective, external side wall forming an outer surface of the device, the side wall being at least partially disposed in the recessed portion of the substrate, wherein a first portion of the side wall is disposed above a height of the light emitter chip, wherein a second portion of the side wall is disposed below a level of the light emitter chip, wherein the first portion of the side wall contacts the layer of phosphor-containing encapsulant, and wherein the side wall is spaced apart from the light emitter chip by the layer of phosphor-containing encapsulant thereby retaining the layer of phosphor-containing encapsulant.

2. The device according to claim 1, wherein the substrate comprises ceramic.

3. The device according to claim 1, wherein the side wall comprises silicone.

4. The device according to claim 1, wherein the side wall comprises a polymeric material.

5. The device according to claim 1, wherein the side wall comprises at least some light diffusing material.

6. The device according to claim 1, wherein the side wall comprises multiple layers of material.

7. The device according to claim 1, wherein the side wall comprises phosphor.

8. The device according to claim 1, wherein the side wall comprises a filter or light filtering material.

9. The device according to claim 1, wherein the side wall comprises a material adapted to block some light.

10. The device according to claim 1, wherein the side wall comprises a material adapted to absorb some light.

11. The device according to claim 1, wherein the substrate comprises alumina.

12. The device according to claim 1, wherein the substrate comprises aluminum nitride.

13. The device according to claim 1, further comprising a layer of non-phosphor containing encapsulant provided over the at least one light emitter chip.

14. The device according to claim 1, wherein the side wall comprises phosphor that is non-uniformly dispersed therein.

15. The device according to claim 1, wherein the side wall comprises a thermoplastic material.

16. The device according to claim 1, further comprising at least two layers of phosphor-containing encapsulant disposed over the at least one light emitter chip.

17. A light emitter device comprising:
   a ceramic substrate;
   at least one light emitter chip on a first side of the substrate, wherein the substrate comprises a recessed portion disposed below a level of the light emitter chip;
   a layer of encapsulant disposed over the at least one light emitter chip; and
   a non-reflective, external side wall forming an outer surface of the device being spaced apart from the light emitter chip by the layer of encapsulant for retaining the layer of encapsulant, the side wall being at least partially disposed in the recessed portion of the substrate, wherein a first portion of the non-reflective side wall is disposed above a height of the light emitter chip, and wherein a second portion of the non-reflective side wall is disposed below a level of the light emitter chip.

18. A light emitter device comprising:
   a substrate;
   at least one light emitter chip on a first side of the substrate, wherein the substrate comprises a recessed portion disposed below a level of the light emitter chip;
   a layer of phosphor-containing encapsulant disposed over the at least one light emitter chip; and
   a lateral side wall at least partially disposed in the recessed portion of the substrate, wherein the lateral side wall comprises phosphor that is non-uniformly dispersed therein, wherein a first portion of the lateral side wall is disposed above a height of the light emitter chip, wherein a second portion of the lateral side wall is disposed below a level of the light emitter chip, wherein the first portion of the lateral side wall contacts the layer of phosphor-containing encapsulant, and wherein the lateral side wall is spaced apart from the light emitter chip by the layer of phosphor-containing encapsulant thereby retaining the layer of phosphor-containing encapsulant.

* * * * *